(12) United States Patent
Yamamoto

(10) Patent No.: US 11,309,344 B2
(45) Date of Patent: Apr. 19, 2022

(54) IMAGING DEVICE, SOLID STATE IMAGE SENSOR, AND ELECTRONIC DEVICE

(71) Applicant: Sony Semiconductor Solutions Corporation, Kanagawa (JP)

(72) Inventor: Atsushi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 16/616,164

(22) PCT Filed: May 15, 2018

(86) PCT No.: PCT/JP2018/018639
§ 371 (c)(1),
(2) Date: Nov. 22, 2019

(87) PCT Pub. No.: WO2018/221192
PCT Pub. Date: Dec. 6, 2018

(65) Prior Publication Data
US 2020/0083270 A1  Mar. 12, 2020

(30) Foreign Application Priority Data

May 29, 2017  (JP) .............................. JP2017-105714

(51) Int. Cl.
  *H01L 27/146*  (2006.01)
  *H04N 5/225*  (2006.01)
(52) U.S. Cl.
  CPC .... *H01L 27/14625* (2013.01); *H01L 27/1462* (2013.01); *H01L 27/14618* (2013.01);
  (Continued)

(58) Field of Classification Search
  CPC ......... H01L 27/14625; H01L 27/14618; H01L 27/1462; H01L 27/14623; H04N 5/22525
  (Continued)

(56) References Cited

U.S. PATENT DOCUMENTS 8,546,739 B2  10/2013  Hsuan et al.
2009/0305451 A1  12/2009  Hsuan et al.
  (Continued)

FOREIGN PATENT DOCUMENTS

CN  101632294 A  1/2010
CN  201662645 U  12/2010
  (Continued)

OTHER PUBLICATIONS

International Search Report and Written Opinion dated Aug. 8, 2018 for International Application No. PCT/JP2018/018638.
  (Continued)

*Primary Examiner* — Thinh T Nguyen
(74) *Attorney, Agent, or Firm* — Wolf, Greenfield & Sacks, P.C.

(57) ABSTRACT

To suppress generation of flare and ghosts. A solid state image sensor includes: a pixel array configured to generate a pixel signal according to an amount of incident light by photoelectric conversion in units of pixels arranged in an array manner; a glass substrate bonded with a light-receiving surface of the pixel array; and a light-shielding film formed on a peripheral portion that is an outside of an effective pixel region of the pixel array, in which the light-shielding film is formed at a front stage of the glass substrate. The present disclosure can be adapted to an imaging device.

15 Claims, 16 Drawing Sheets

(52) U.S. Cl.
CPC ..... *H01L 27/14623* (2013.01); *H04N 5/2254* (2013.01); *H04N 5/22525* (2018.08)

(58) Field of Classification Search
USPC ........................................ 257/432, 433, 434
See application file for complete search history.

(56) References Cited

U.S. PATENT DOCUMENTS

| | | | |
|---|---|---|---|
| 2011/0156188 A1 | 6/2011 | Tu et al. | |
| 2012/0211852 A1 | 8/2012 | Iwafuchi et al. | |
| 2012/0211855 A1* | 8/2012 | Iwafuchi et al. | H01L 27/14618 257/459 |
| 2015/0138366 A1 | 5/2015 | Keelan et al. | |
| 2015/0146056 A1 | 5/2015 | Hirota | |
| 2016/0313629 A1 | 10/2016 | Lee | |
| 2017/0102483 A1 | 4/2017 | Kawashima et al. | |
| 2017/0283587 A1 | 10/2017 | Hamada et al. | |
| 2020/0176496 A1 | 6/2020 | Kimura et al. | |

FOREIGN PATENT DOCUMENTS

| | | | |
|---|---|---|---|
| CN | 105093472 A | 11/2015 | |
| CN | 106461831 A | 2/2017 | |
| EP | 2 341 540 A2 | 7/2011 | |
| EP | 2 490 262 A2 | 8/2012 | |
| JP | 2004-207461 A | 7/2004 | |
| JP | 2008-270650 A | 11/2008 | |
| JP | 2009-153178 A | 7/2009 | |
| JP | 2012-014133 A | 1/2012 | |
| JP | 2012-150468 A | 8/2012 | |
| JP | 2012-169556 A | 9/2012 | |
| JP | 2012-186434 A | 9/2012 | |
| JP | 2014-130343 A | 7/2014 | |
| JP | 2015-061193 A | 3/2015 | |
| JP | 2016-219488 A | 12/2016 | |
| WO | WO 2006/088051 A1 | 8/2006 | |
| WO | WO 2008/102575 A1 | 8/2008 | |
| WO | WO-2016114362 A | 7/2016 | |
| WO | WO 2016/129324 A1 | 8/2016 | |
| WO | WO 2016/129381 A1 | 8/2016 | |

OTHER PUBLICATIONS

International Preliminary Report on Patentability dated Dec. 12, 2019 in connection with International Application No. PCT/JP2018/018638.

International Preliminary Report on Patentability dated Dec. 12, 2019 in connection with International Application No. PCT/JP2018/018639.

Japanese Office Action dated Apr. 5, 2021 in connection with Japanese Application No. 2017-105714 and English translation thereof.

Japanese Office Action dated Nov. 24, 2020 in connection with Japanese Application No. 2017-105714 and English translation thereof.

International Search Report and Written Opinion dated Aug. 1, 2018 in connection with International Application No. PCT/JP2018/018639.

Japanese Office Action dated Mar. 12, 2021 in connection with Japanese Application No. 2017-105713 and English translation thereof.

* cited by examiner

IMAGING DEVICE, SOLID STATE IMAGE SENSOR, AND ELECTRONIC DEVICE

CROSS REFERENCE TO RELATED APPLICATIONS

This application claims the benefit under 35 U.S.C. § 371 as a U.S. National Stage Entry of International Application No. PCT/JP2018/018639, filed in the Japanese Patent Office as a Receiving Office on May 15, 2018, which claims priority to Japanese Patent Application Number JP 2017-105714, filed in the Japanese Patent Office on May 29, 2017, each of which is hereby incorporated by reference in its entirety.

TECHNICAL FIELD

The present disclosure relates to an integrated assembly for an imaging device comprising: a pixel array mounted in; an optical assembly comprising one or more transparent materials mounted with the pixel array in the integrated assembly, a solid state image sensor, and an electronic device, and especially relates to an imaging device, a solid state image sensor, and an electronic device that can decrease flare and ghosts.

CROSS REFERENCE TO RELATED APPLICATIONS

This application claims the benefit of Japanese Priority Patent Application JP 2017-105714 filed on May 29, 2017, the entire contents of which are incorporated herein by reference.

BACKGROUND ART

As an integrated assembly configuration of a solid state image sensor (image sensor) represented by a complementary metal oxide semiconductor (CMOS) having a chip size package (CSP) structure, a technology to protect the solid state image sensor having a CSP structure by bonding a glass substrate onto an imaging surface, using a transparent adhesive has been proposed (see PTL 1 and PTL 2).

CITATION LIST

Patent Literature

[PTL 1] JP 2004-207461 A
[PTL 2] JP 2008-270650 A

SUMMARY OF INVENTION

Technical Problem

By the way, the technologies described in PTL 1 and PTL 2, an infrared cut filter (IRCF) is provided at a position separated from the glass substrate with respect to an entering direction of light. In the IRCF, a light-shielding film for suppressing generation of flare or ghosts is formed on a peripheral portion that surrounds an outer periphery.

However, since the IRCF and the glass substrate are separated, the light-shielding film provided on the peripheral portion of the IRCF is not sufficient as measures against the flare and ghosts.

Further, the light-shielding film is formed on the peripheral portion of the IRCF by printing, and the IRCF on which the light-shielding film is formed is arranged at a front stage of the solid state image sensor. The positional accuracy is not sufficient both in the case where the light-shielding film is printed and in the case where the light-shielding film is arranged at the front stage of the solid state image sensor, and the light-shielding film is not sufficient as the measurement against the flare and ghosts.

Further, measurement against flare due to stray light reflected at an end surface of the glass substrate in a solid state image sensor having a wafer level chip size package (WCSP) structure is also not sufficient.

It is an object of the present invention to provide an improved integrated assembly which overcomes the above mentioned fallbacks.

Such an integrated assembly is provided by the present invention:

According to a first aspect of the present invention such an integrated assembly for an imaging device comprises:

a pixel array mounted in;
an optical assembly comprising one or more transparent materials mounted with the pixel array in the integrated assembly and
a light shield arranged to block light at a periphery of the integrated assembly, wherein a part of the light shield is disposed on at least one of the one or more transparent materials.

The present disclosure has been made in view of the foregoing, and especially enables suppression of generation of flare and ghosts by forming a light-shielding film on a peripheral portion of a light-receiving surface of a glass substrate bonded on an imaging surface of a solid state image sensor with a transparent adhesive.

Solution to Problem

Some embodiments relate to an imaging device comprising a pixel array mounted in an integrated assembly; an optical assembly comprising one or more transparent materials mounted with the pixel array in the integrated assembly; and a light shield arranged to block light at a periphery of the integrated assembly, a part of the light shield disposed on at least one of the one or more transparent materials.

Some embodiments relate to a camera module including an imaging apparatus, the imaging apparatus comprising a pixel array mounted in an integrated assembly; an optical assembly comprising one or more transparent materials mounted with the pixel array in the integrated assembly; a light shield arranged to block light at a periphery of the integrated assembly, a part of the light shield disposed on at least one of the one or more transparent materials; and a plurality of lenses mounted apart from the pixel array.

Some embodiments relate to an electronic apparatus comprising a solid state image sensor comprising: a pixel array mounted in an integrated assembly; an optical assembly comprising one or more transparent materials mounted with the pixel array in the integrated assembly; and a light shield arranged to block light at a periphery of the integrated assembly, a part of the light shield disposed on at least one of the one or more transparent materials. The electronic apparatus can further include a plurality of lenses mounted apart from the pixel array; a signal processing circuit arranged to receive signals from sensors in the pixel array; memory arranged to store image data; a monitor arranged to display image data; and a drive circuit configured to control transfer of signal electric charges in the solid state image sensor.

Advantageous Effects of Invention

According to one aspect of the present disclosure, generation of flare and ghosts can be suppressed.

DESCRIPTION OF EMBODIMENTS

Favorable embodiments of the present disclosure will be described in detail with reference to the appended drawings. Note that, in the present specification and drawings, overlapping description of configuration elements having substantially the same functional configuration is omitted by providing the same sign.

Hereinafter, embodiments for implementing the present disclosure (hereinafter, embodiments) will be described. Note that the description will be given in the following order.

1. Principle of Generation of Flare and Ghosts
2. First Embodiment
3. Second Embodiment
4. Third Embodiment
5. Fourth Embodiment
6. Fifth Embodiment
7. Sixth Embodiment
8. Seventh Embodiment
9. Eighth Embodiment
10. Ninth Embodiment
11. Application to Electronic Device
12. Use Example of Solid State Image Sensor
13. Application Example to Endoscope Surgery System
14. Application Example to Moving Body

1. Principle of Generation of Flare and Ghosts

A principle of generation of flare and ghosts will be described in describing a configuration of an imaging device of an embodiment of the present disclosure.

Figure 1:
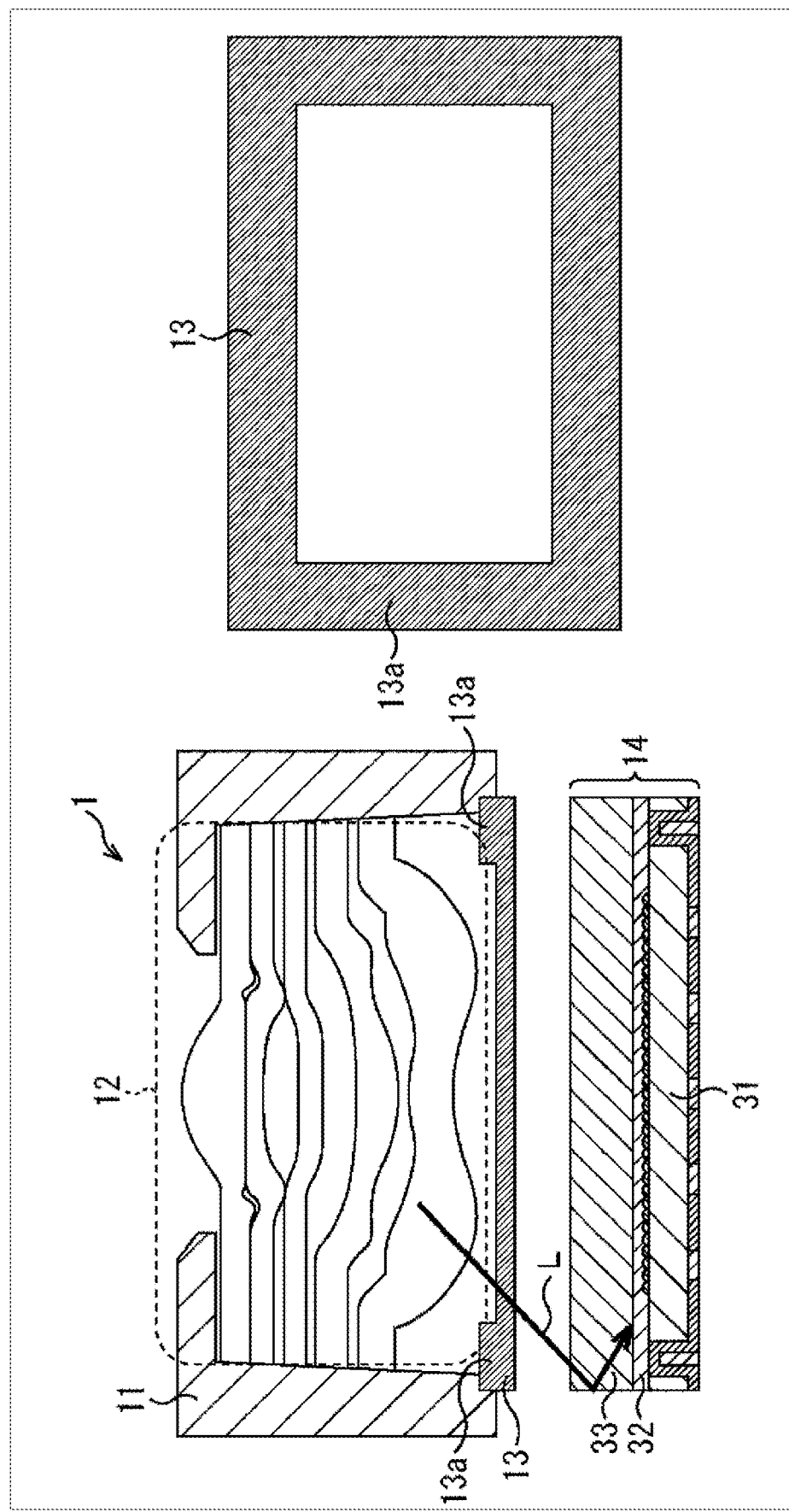
FIG. 1 is a diagram illustrating a principle of generation of flare and ghosts.

First, a configuration example of an imaging device will be described with reference to FIG. 1. Note that the left portion in FIG. 1 is a side sectional view of an imaging device 1 and incident light enters in a downward direction from above in FIG. 1. Further, the right portion in FIG. 1 is a top view of an infrared cut filter (IRCF) 13 as viewed from a position of a light source of the incident light.

The imaging device 1 is configured from a case 11, a lens group 12, an IRCF 13, and an integrated assembly formed as a solid state image sensor 14.

The case 11 has an approximately cylindrical configuration provided with an opening portion with respect to an optical axis direction and has the lens group 12 built in, the lens group 12 being configured from a plurality of lenses.

The lens group 12 is configured from a plurality of lenses, and condenses and focuses the incident light on an imaging surface of the solid state image sensor 14.

The IRCF 13 is installed at a position of a bottom portion with respect to an entering direction of the light, of the case 11, and cuts an infrared component, of components of the light focused on and transmitted through the imaging surface of the solid state image sensor 14 with the lens group 12.

The solid state image sensor 14 is an image sensor having a cavityless chip size package (CSP) structure, and has a configuration in which an optical assembly is formed by a glass substrate 33 and a transparent adhesive (32) which bonds the glass substrate 33 on an imaging surface of a pixel array 31. The cavityless structure is a structure without a cavity (hollow) between the pixel array 31 and the glass substrate 33. The pixel array 31 is configured from pixels arranged in an array manner, and generates a pixel signal according to an amount of received light by performing photoelectric conversion of incident light condensed by the lens group 12 in units of pixels, and outputs the pixel signal to a latter-stage device (not illustrated) as a pixel signal.

By the way, as illustrated in the right portion in FIG. 1, the IRCF 13 has a light-shielding film 13a formed on a peripheral portion, and the light-shielding film 13a prevents penetration of stray light. Note that the light-shielding film 13a is not provided in a central portion (the white square range in FIG. 1) of the IRCF 13, and the IRCF 13 cuts and transmits infrared light of the incident light condensed by the lens group 12.

However, the IRCF 13 and the glass substrate 33 of the solid state image sensor 14 are provided with a space. Therefore, in the light transmitted through the lens group 12, there is light that can be stray light like a ray of light L illustrated by the arrow in FIG. 1 and may not be able to be shielded by the light-shielding film 13a. In the case of FIG. 1, the ray of light L is transmitted through the central portion of the IRCF 13, is reflected at an end surface of the glass substrate 33 of the solid state image sensor 14, enters the imaging surface of the pixel array 31, and causes flare or ghosts.

2. First Embodiment

Next, a configuration example of a first embodiment of an imaging device comprising an integrated assembly (imaging or solid state image sensor 14) according to the present invention will be described with reference to FIG. 2. Note that, in FIG. 2, the upper section is a side sectional view of an imaging device 1 and the lower section is a top view of a light-shielding film 34 as viewed from an entering direction of incident light. Further, in the imaging device 1 in FIG. 2, a configuration having the same function as the imaging device 1 in FIG. 1 is denoted with the same sign and description of the configuration is appropriately omitted.

Figure 2:
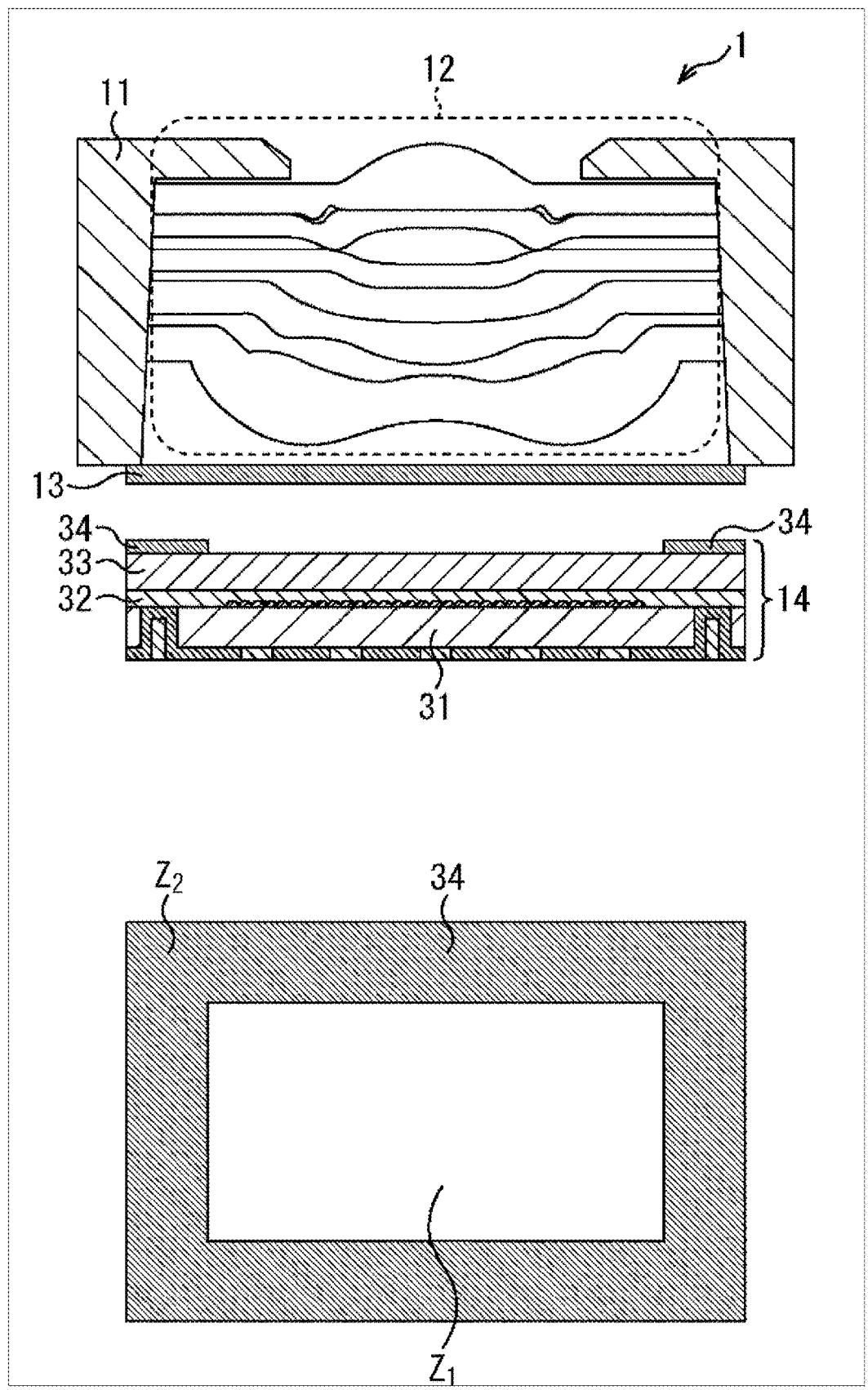
FIG. 2 is a diagram illustrating a configuration example of a first embodiment of an imaging device.

That is, different points in the imaging device 1 in FIG. 2 from the imaging device 1 in FIG. 1 are that an IRCF 13 on which no light-shielding film 13a is formed is provided, and a light-shielding film 34 is further formed on a peripheral portion Z2 on a surface (an upper surface in FIG. 2) of a glass substrate 33, where the incident light enters. Note that the light-shielding film 34 is not formed in a central portion Z1, and the central portion Z1 transmits incident light from which infrared light is cut.

The light-shielding film 34 is formed of photosensitive black resist, and is desirably formed on the glass substrate 33 by photolithography before dicing in a semiconductor process in manufacturing the solid state image sensor 14. When the light-shielding film 34 is formed on the glass substrate 33 before dicing, an end portion of the light-shielding film 34 and an end portion of the solid state image sensor 14 become the same plane.

With such a configuration, the light-shielding film 34 provided on the glass substrate 33 in the imaging device 1 in FIG. 2 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed on the glass substrate 33 bonded onto the pixel array 31 with a transparent adhesive. Therefore, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

3. Second Embodiment

In the above embodiment, an example of providing the IRCF 13 immediately under a lens group 12 has been described. However, an IRCF may be formed on a light-receiving surface side of a glass substrate 33, and a light-shielding film 34 may be provided below the IRCF.

Figure 3:
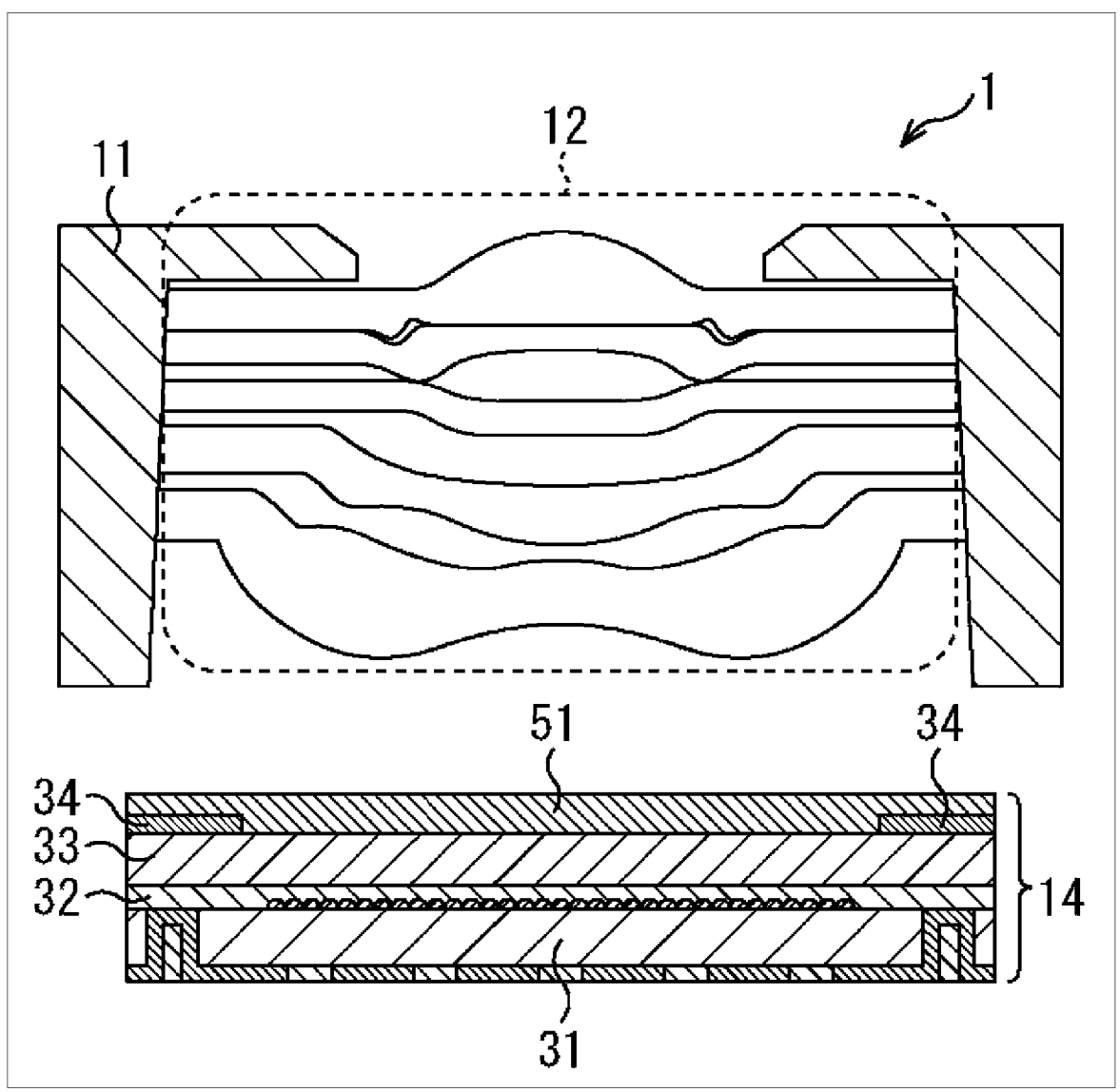
FIG. 3 is a diagram illustrating a configuration example of a second embodiment of an imaging device.

FIG. 3 illustrates a configuration example of an imaging device 1 in which an IRCF 51 corresponding to the IRCF 13 is formed on light-receiving surface sides of the glass substrate 33 and the light-shielding film 34. Note that, in the imaging device 1 in FIG. 3, a configuration having the same function as the imaging device 1 in FIG. 2 is denoted with the same sign and description of the configuration is appropriately omitted.

That is, a different point in the imaging device 1 in FIG. 3 from the imaging device 1 in FIG. 2 is that the IRCF 51 is formed on the light-receiving surface sides of the glass substrate 33 and the light-shielding film 34.

In the imaging device 1 in FIG. 3, the light-shielding film 34 provided on the glass substrate 33 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

4. Third Embodiment

In the above embodiment, an example of providing the light-shielding film 34 on the light-receiving surface side of incident light, of the IRCF 51, has been described. However, a non-flat film may be formed on an upper surface of an IRCF 51. The non-flat film is, for example, an optical element such as a lens, a wafer level lens (WLL), or an organic multi-layer film having higher non-flatness than a predetermined value, and is, for example, a glass lens, a resin lens, a single-layer WLL, a laminated WLL, an optical filter, or an organic multi-layer film for protecting the IRCF 51. When a lens or a WLL is used as a non-flat film 71, a camera module to which a solid state image sensor 14 is attached can be decreased in height. As the lens or the WLL, a single lens having a convex surface or a concave surface may be provided on the light-receiving surface side, or a lens made of a combination of a plurality of lenses may be provided.

Figure 4:
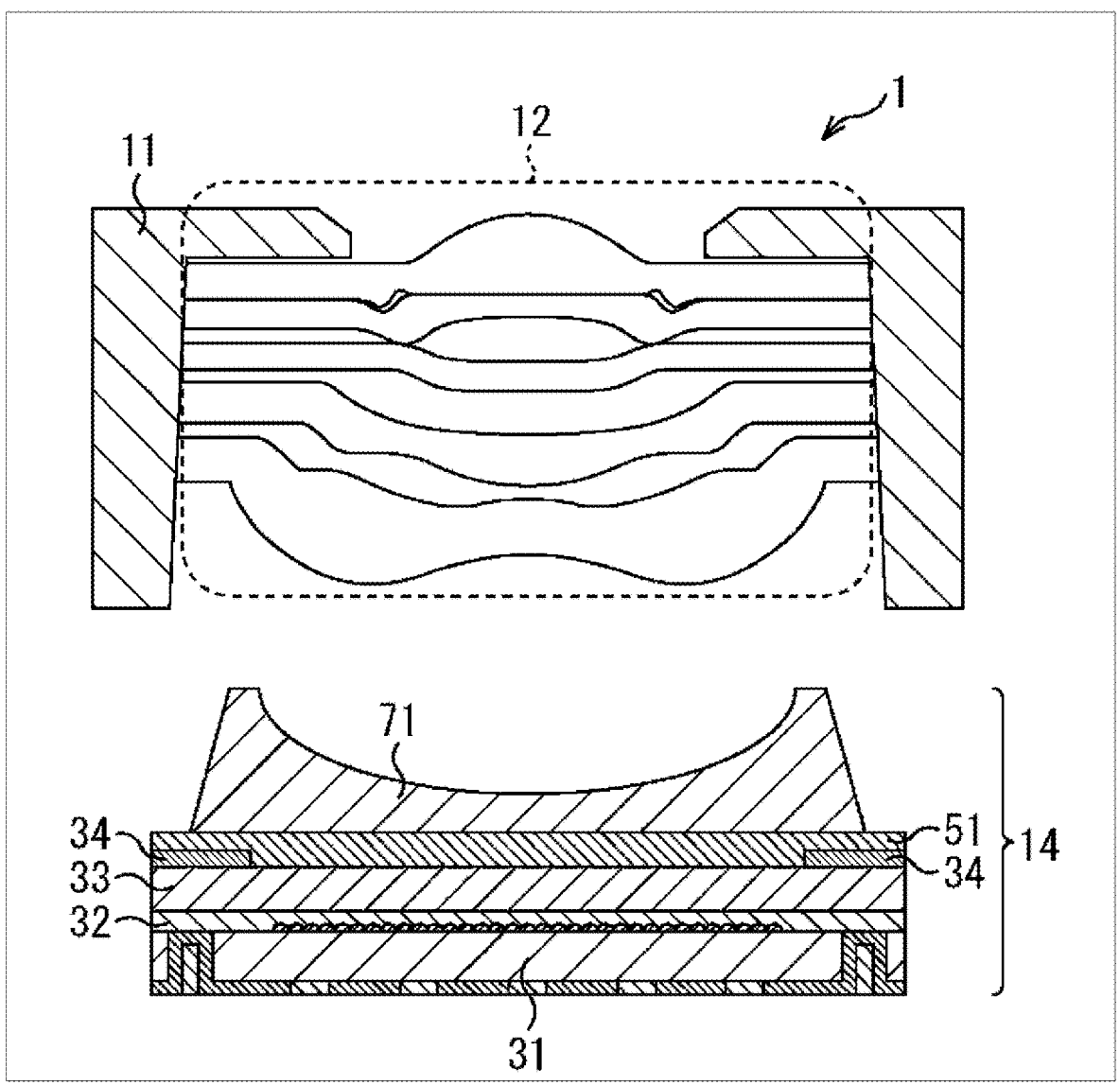
FIG. 4 is a diagram illustrating a configuration example of a third embodiment of an imaging device.

FIG. 4 illustrates a configuration example of an imaging device 1 in which the non-flat film is formed on an upper surface of the IRCF 51. Note that, in the imaging device 1 in FIG. 4, a configuration having the same function as the imaging device 1 in FIG. 3 is denoted with the same sign and description of the configuration is appropriately omitted.

That is, a different point in the imaging device 1 in FIG. 4 from the imaging device 1 in FIG. 3 is that the non-flat film 71 is formed on the upper surface of the IRCF 51.

In the imaging device 1 in FIG. 4, a light-shielding film 34 provided below the IRCF 51 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

5. Fourth Embodiment

In the above embodiment, an example of providing the light-shielding film 34 on the glass substrate 33 has been described. However, an IRCF 51 may be provided on a glass substrate 33 and a light-shielding film 34 may be provided on a light-receiving surface side of incident light, of the IRCF 51.

Figure 5:
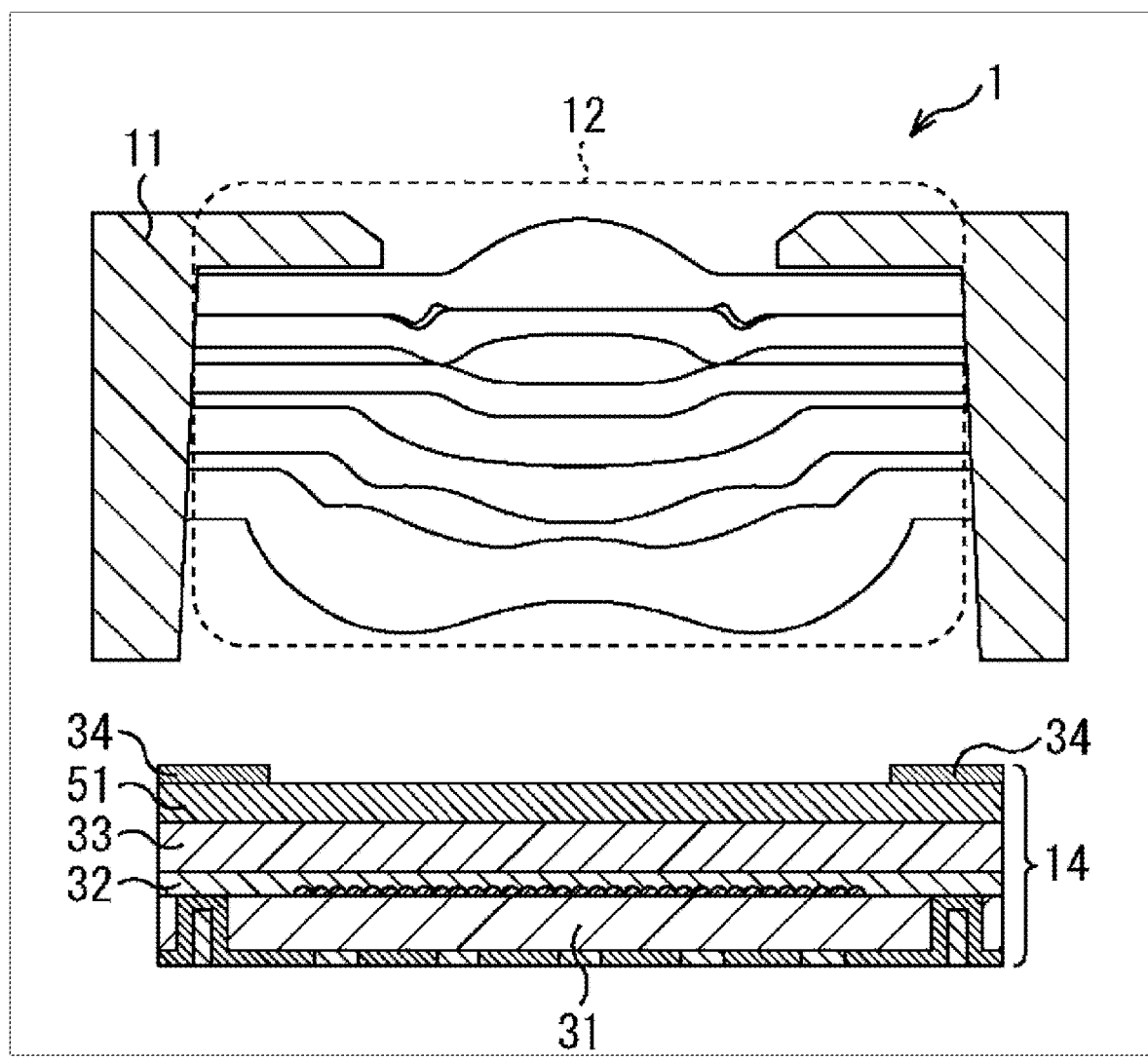
FIG. 5 is a diagram illustrating a configuration example of a fourth embodiment of an imaging device.

FIG. 5 illustrates a configuration example of an imaging device 1 in which an IRCF 51 is provided on the glass substrate 33, and the light-shielding film 34 is provided on the light-receiving surface side of incident light, of the IRCF 51. Note that, in the imaging device 1 in FIG. 5, a configuration having the same function as the imaging device 1 in FIG. 3 is denoted with the same sign and description of the configuration is appropriately omitted.

That is, a different point in the imaging device 1 in FIG. 5 from the imaging device 1 in FIG. 3 is that the light-shielding film 34 is provided on an upper surface of the IRCF 51 in FIG. 5, instead of on the glass substrate 33. In some cases, the glass substrate 33 may not be included.

In the imaging device 1 in FIG. 5, the light-shielding film 34 provided on the upper surface of the IRCF 51 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

6. Fifth Embodiment

In the above embodiment, an example of providing the light-shielding film 34 on the light-receiving surface side of incident light, of the IRCF 51, has been described. However, a non-flat film may be formed on an upper surface of an IRCF 51.

Figure 6:
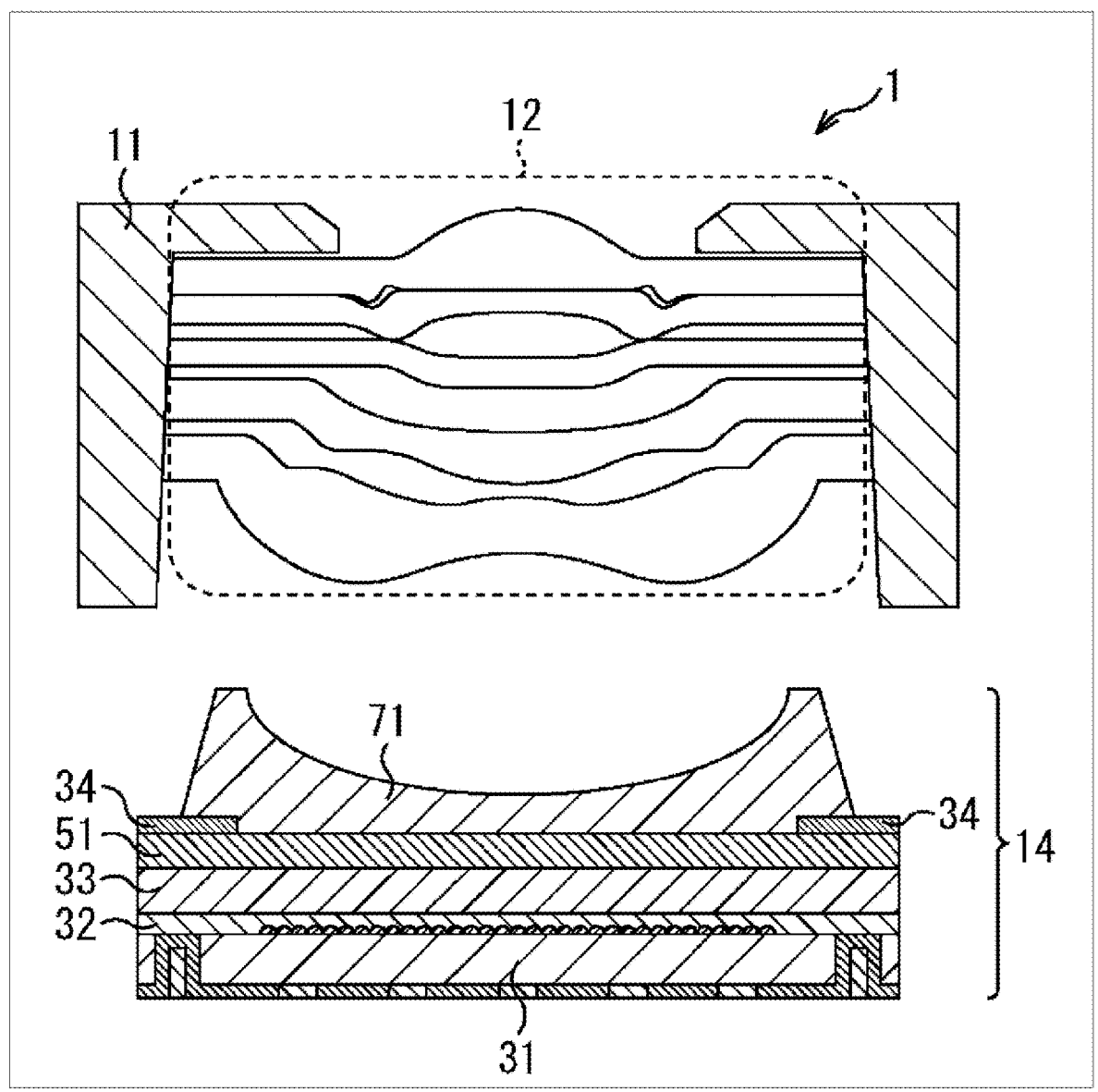
FIG. 6 is a diagram illustrating a configuration example of a fifth embodiment of an imaging device.

FIG. 6 illustrates a configuration example of an imaging device 1 in which a light-shielding film 34 is provided on a light-receiving surface side of incident light, of the IRCF 51, and a non-flat film is further formed on an upper surface of the IRCF 51. In some cases, the glass substrate 33 may not be included. Note that, in the imaging device 1 in FIG. 6, a configuration having the same function as the imaging device 1 in FIG. 5 is denoted with the same sign and description of the configuration is appropriately omitted.

That is, a different point in the imaging device 1 in FIG. 6 from the imaging device 1 in FIG. 5 is that a non-flat film 71 is formed on the upper surface of the IRCF 51.

In the imaging device 1 in FIG. 6, the light-shielding film 34 provided on the upper surface of the IRCF 51 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

7. Sixth Embodiment

In the above embodiment, an example of providing the light-shielding film 34 on the light-receiving surface side of incident light, of the glass substrate 33 or of the IRCF 51, and further forming the non-flat film 71 on the upper surface of the IRCF 51 has been described. However, a light-shielding film may be formed on an upper surface of a non-flat film 71 in FIG. 7 in accordance with a surface shape of the non-flat film 71.

Figure 7:
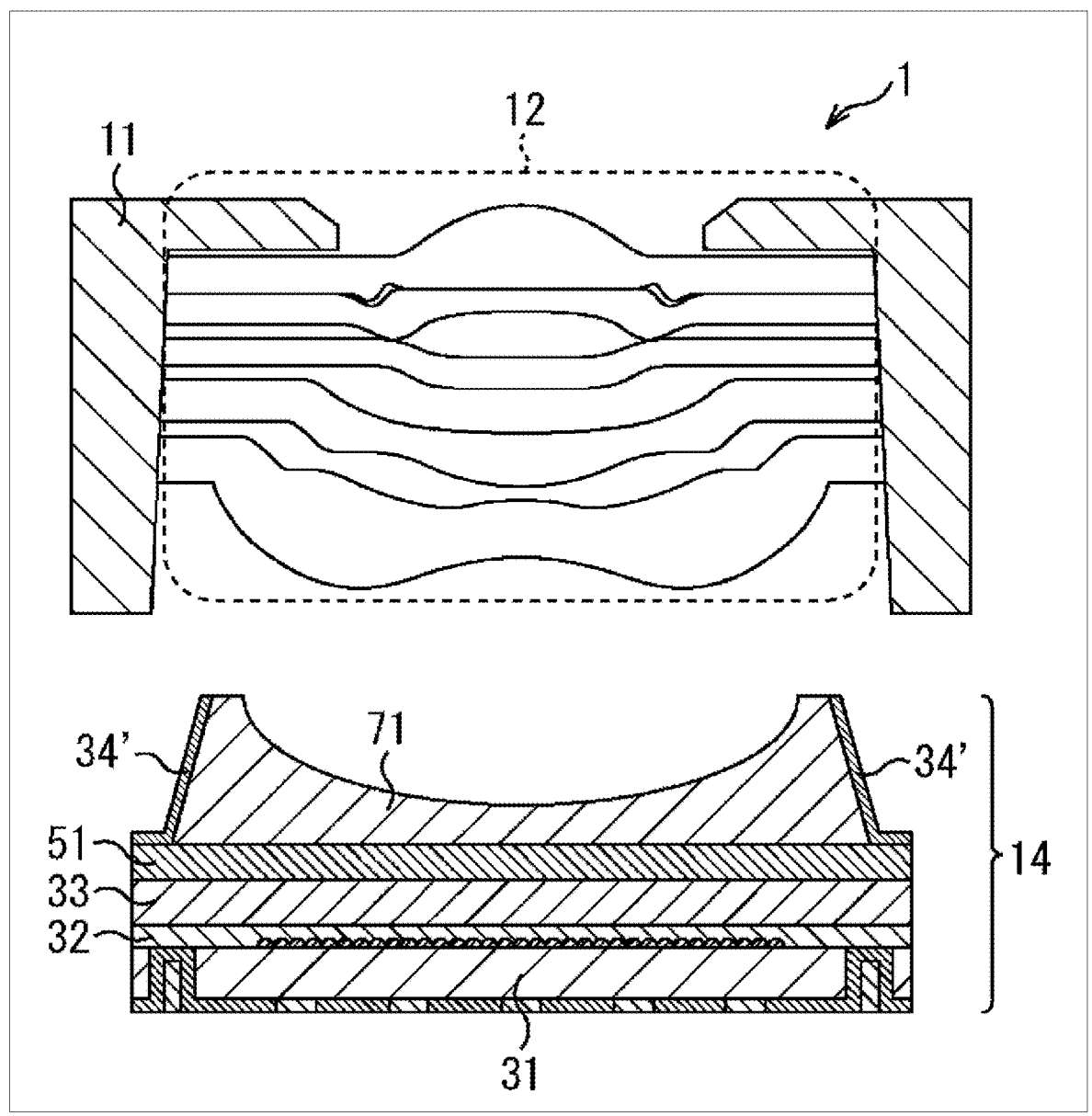
FIG. 7 is a diagram illustrating a configuration example of a sixth embodiment of an imaging device.

FIG. 7 illustrates a configuration example of an imaging device 1 in which an IRCF 51 is provided on a glass substrate 33, the non-flat film 71 is further provided on the IRCF 51, and then a light-shielding film is formed on peripheral portions of upper surfaces of the non-flat film 71 and the IRCF 51. In some cases, the glass substrate 33 may not be included. Note that, in the imaging device 1 in FIG. 7, a configuration having the same function as the imaging device 1 in FIG. 6 is denoted with the same sign and description of the configuration is appropriately omitted.

That is, a different point in the imaging device 1 in FIG. 7 from the imaging device 1 in FIG. 6 is that a light-shielding film 34' is formed on the upper surface of the non-flat film 71 in FIG. 6 and on the peripheral portion of the non-flat film 71.

Here, the light-shielding portion 34' is formed in accordance with the surface shape of the upper surface of the non-flat film 71 in FIG. 7. At this time, the light-shielding portion 34' is a non-photosensitive black material, and is desirably formed by inkjet, for example. When the light-shielding film 34' is formed on the glass substrate 33 before dicing, an end portion of the light-shielding film 34' and an end portion of a solid state image sensor 14 become the same plane.

In the imaging device 1 in FIG. 7, the light-shielding film 34' provided on the upper surface of the non-flat film 71 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

8. Seventh Embodiment

In the above embodiment, an example in which the solid state image sensor 14 is an image sensor having a cavityless chip size package (CSP) structure has been described. However, a solid state image sensor 14 may be an image sensor having a CSP structure including a cavity.

Figure 8:
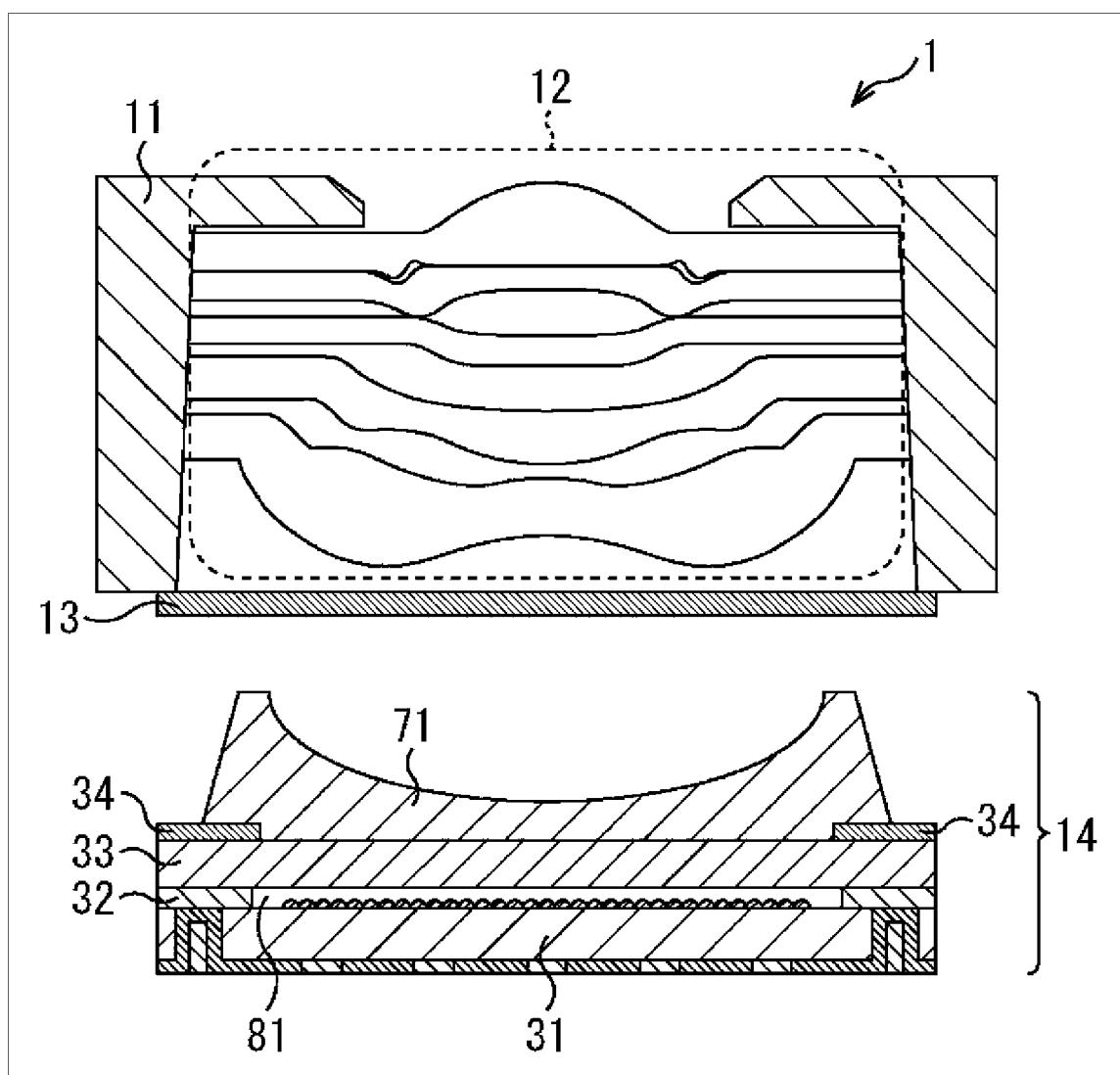
FIG. 8 is a diagram illustrating a configuration example of a seventh embodiment of an imaging device.

FIG. 8 illustrates a configuration example of an imaging device 1 of a case where a solid state image sensor 14 has a CSP structure including a cavity. Note that, in the imaging device 1 in FIG. 8, a configuration having the same function as the imaging device 1 in FIG. 2 is denoted with the same sign and description of the configuration is appropriately omitted.

That is, the imaging device 1 in FIG. 8 has a configuration in which the solid state image sensor 14 having a CSP structure including a cavity is provided, and a non-flat film 71 is further formed on a glass substrate 33 and a light-shielding film 34, in place of the solid state image sensor 14 having a cavityless CSP structure in the imaging device 1 in FIG. 2.

To be specific, peripheral portions of the glass substrate 33 and a pixel array 31 are bonded with an adhesive 32, and a cavity (hollow) 81 is formed between the pixel array 31 and the glass substrate 33 in an effective pixel region of the pixel array 31.

With such a configuration, a light-shielding film 34 provided on the glass substrate 33 in the imaging device 1 in FIG. 8 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed on the glass substrate 33 bonded onto the pixel array 31 with the transparent adhesive 32. Therefore, the light-shielding film 34 can be formed up to a range serving as a boundary of the effective pixel region on the pixel array 31 with high positional accuracy, and thus can suppress penetration of stray light with high accuracy.

As a result, penetration of stray light is prevented, whereby generation of flare and ghosts can be suppressed.

9. Eighth Embodiment

In the above embodiment, an example in which the solid state image sensor 14 has a CSP structure including a cavity, the light-shielding film 34 is provided on the peripheral portion on the glass substrate 33, and the non-flat film 71 is further formed on the glass substrate 33 and the light-shielding film 34 has been described. However, a configuration using the light-shielding film 34' described with reference to FIG. 7 in place of the light-shielding film 34 may be employed.

Figure 9:
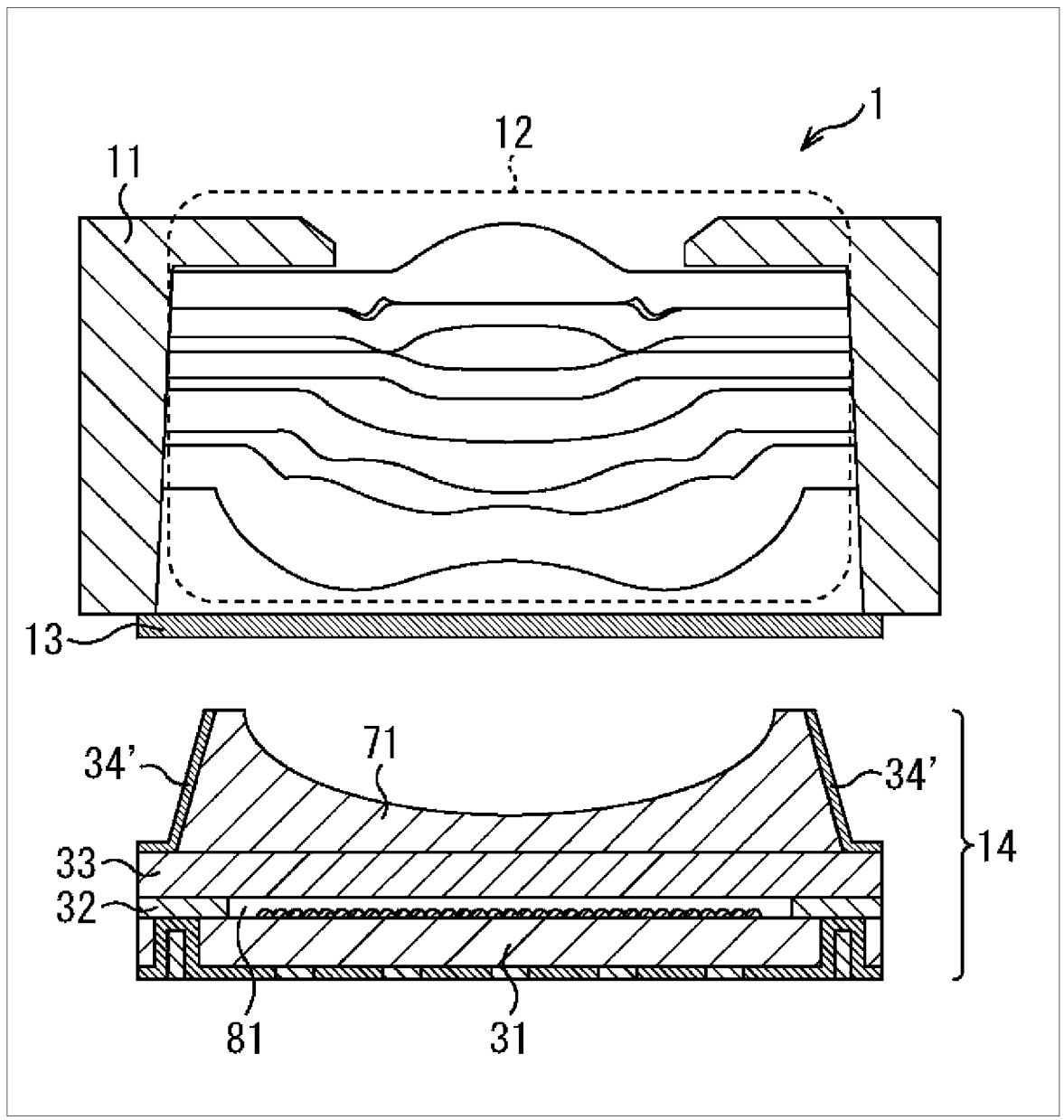
FIG. 9 is a diagram illustrating a configuration example of an eighth embodiment of an imaging device.

FIG. 9 illustrates a configuration example of an imaging device 1 in which a solid state image sensor 14 has a chip size package (CSP) structure including a cavity, and a non-flat film 71 is formed on a glass substrate 33 and a light-shielding film 34' is further formed on the non-flat film 71.

Note that, in the imaging device 1 in FIG. 9, a configuration having the same function as the imaging device 1 in FIG. 8 is denoted with the same sign and description of the configuration is appropriately omitted.

That is, the imaging device 1 in FIG. 9 has a configuration in which the light-shielding film 34 in the imaging device 1 in FIG. 8 is deleted, and the light-shielding film 34' is formed on the non-flat film 71.

In the imaging device 1 in FIG. 9, the light-shielding film 34' provided on the upper surface of the non-flat film 71 is formed at a position closer to a light-receiving surface of a pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

10. Ninth Embodiment

In the above embodiment, an example of the imaging device 1 using the solid state image sensor 14 including the cavity 81 between the pixel array 31 and the glass substrate 33 in the effective pixel region by bonding the outer peripheral portions of the pixel array 31 and the glass substrate 33 with the adhesive 32 has been described.

However, a cavity 81 may be formed in an effective pixel region between a pixel array 31 and a glass substrate 33 by providing a spacer in outer peripheral portions of the pixel array 31 and the glass substrate 33.

Figure 10:
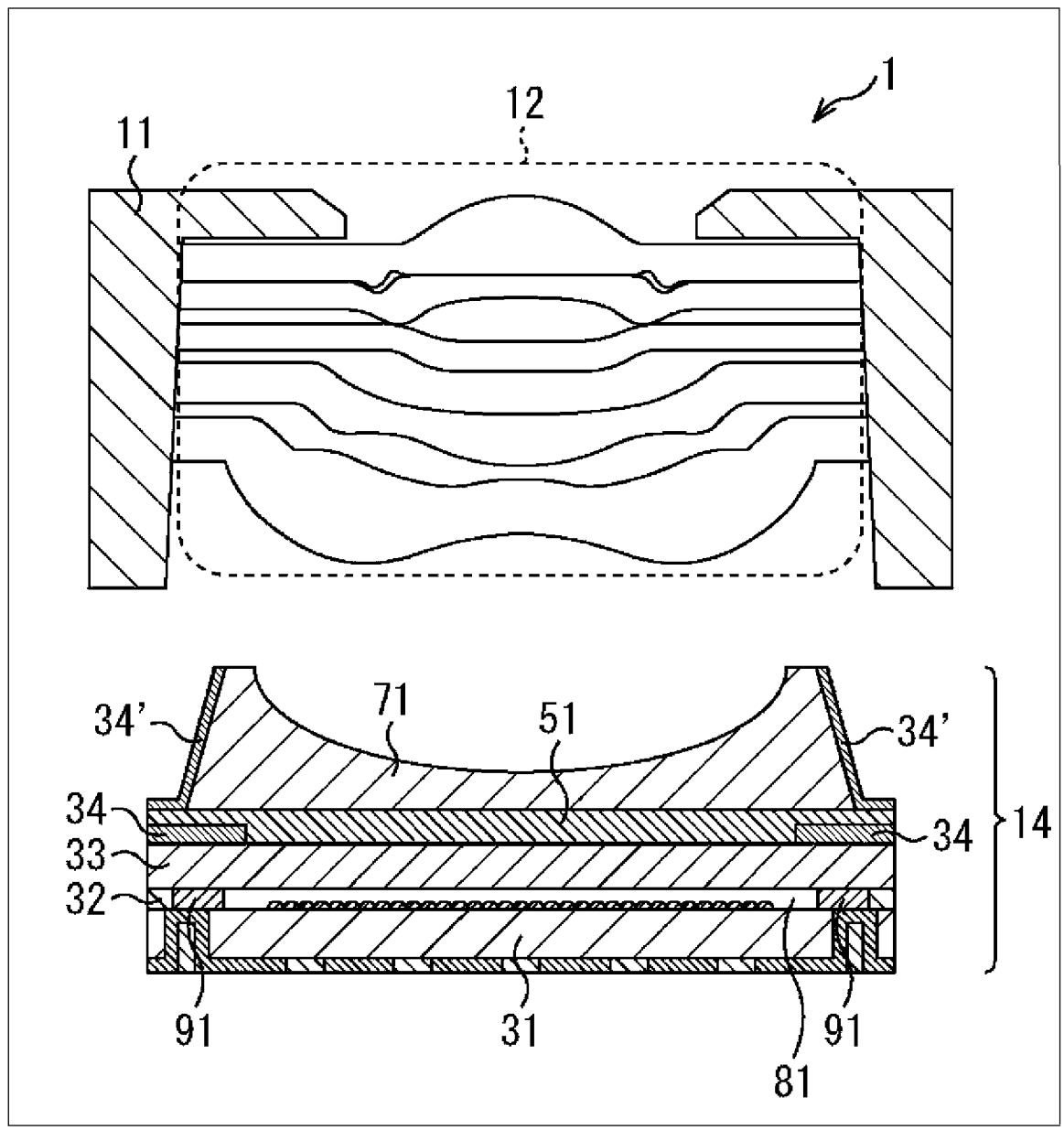
FIG. 10 is a diagram illustrating a configuration example of a ninth embodiment of an imaging device.

FIG. 10 illustrates a configuration example of an imaging device 1 in which a cavity 81 is formed in an effective pixel region between a pixel array 31 and a glass substrate 33 by providing a spacer 91 in outer peripheral portions of the pixel array 31 and the glass substrate 33.

Note that, in the imaging device 1 in FIG. 10, a configuration having the same function as the imaging device 1 in FIG. 4 is denoted with the same sign and description of the configuration is appropriately omitted.

Further, in the imaging device 1 in FIG. 10, an IRCF 51 having a light-shielding film 34 provided in a lower portion is formed on a light-receiving surface side of the glass substrate 33, and a non-flat film 71 having a light-shielding film 34' provided on an upper surface is further formed on an upper surface of the IRCF 51.

That is, in the imaging device 1 in FIG. 10, the light-shielding film 34 and the light-shielding film 34' are provided.

In the imaging device 1 in FIG. 10, both the light-shielding film 34' provided on the upper surface of the non-flat film 71 and the light-shielding film 34 provided in the lower portion of the IRCF 51 are provided at positions closer to a light-receiving surface of the pixel array 31 than the light-shielding film 13a provided on the IRCF 13 in the imaging device 1 in FIG. 1, thereby to be able to prevent penetration of stray light like a ray of light L illustrated in FIG. 1.

Further, with such a configuration, the light-shielding film 34 can be formed up to a range serving as a boundary of an effective pixel region on the pixel array 31 with high positional accuracy, and thus can suppress penetration of stray light with high accuracy.

As a result, penetration of stray light is prevented, whereby generation of flare and ghosts can be suppressed.

Note that the solid state image sensor 14 may have a cavityless configuration, as illustrated in the imaging devices 1 of the first to sixth embodiments described with reference to FIGS. 2 to 7. Further, the solid state image sensor 14 may have a configuration with a cavity, as illustrated in the imaging devices 1 of the seventh to ninth embodiments described with reference to FIGS. 8 to 10.

Further, the configuration of the solid state image sensor 14 with a cavity may be a configuration including the spacer 91, as illustrated in the imaging device 1 of the ninth embodiment with reference to FIG. 10, or may be a configuration without the spacer 91, as illustrated in the imaging devices 1 of the seventh and eighth embodiments described with reference to FIGS. 8 and 9.

Further, the IRCF may be provided as the IRCF 13 on the bottom portion of the case 11 side having the lens group 12 built in, as illustrated in the imaging devices 1 of the first, seventh, and eighth embodiments described with reference to FIGS. 2, 8, and 9. Further, the IRCF may be provided as the IRCF 51 on the glass substrate 33, as illustrated in the imaging devices 1 of the second to sixth, and ninth embodiments described with reference to FIGS. 3 to 7, and 10.

Further, the light-shielding film may be formed on the glass substrate 33 as the light-shielding film 34 (the light-shielding film may be provided under the IRCF 51), as illustrated in the imaging devices 1 of the first to third, seventh, and ninth embodiments described with reference to FIGS. 2 to 4, 8, and 10. Further, the light-shielding film may be provided on the IRCF 51 as the light-shielding film 34, as illustrated in the imaging devices 1 of the fourth and fifth embodiments described with reference to FIGS. 5 and 6. Further, the light-shielding film may be provided on the non-flat film 71 as the light-shielding film 34', as illustrated in the imaging devices 1 of the sixth, eighth, and ninth embodiments described with reference to FIGS. 7, 9, and 10. Further, the light-shielding film may have a configuration including both the light-shielding film 34 and the light-shielding film 34', as illustrated in the imaging device 1 of the ninth embodiment described with reference to FIG. 10.

Further, any of the following configurations is applicable and can be freely combined: existence or non-existence of the cavity 81 in the pixel array 31, existence or non-existence of the spacer 91, whether the IRCF is the IRCF 13 provided on the bottom portion of the case 11 or the IRCF 51 provided on the glass substrate 33, whether the light-shielding film is formed on the glass substrate 33 or on the IRCF 51 as the light-shielding film 34, and whether the light-shielding film is formed on the non-flat film 71 as the light-shielding film 34'.

One or more features shown in the above example embodiments may be applied to other example embodiments that do not include the one or more features. Suitable combinations of features other than those shown are also possible. As described above, according to the imaging device 1 of an embodiment of the present disclosure, the light-shielding film 34 is formed at a front stage of the glass substrate 33, which is on the light source side of the incident light with respect to the glass substrate 33. Therefore, penetration of stray light can be prevented, resulting in suppression of generation of flare and ghosts. Here, generation of flare and ghosts can be suppressed with higher accuracy if the light-shielding film 34 is closer to the glass substrate 33.

11. Application to Electronic Device

The imaging device 1 in FIGS. 2 to 10 can be applied to various electronic devices such as imaging devices such as a digital still camera and a digital video camera, a mobile telephone device having an imaging function, and another device having the imaging function.

Figure 11:
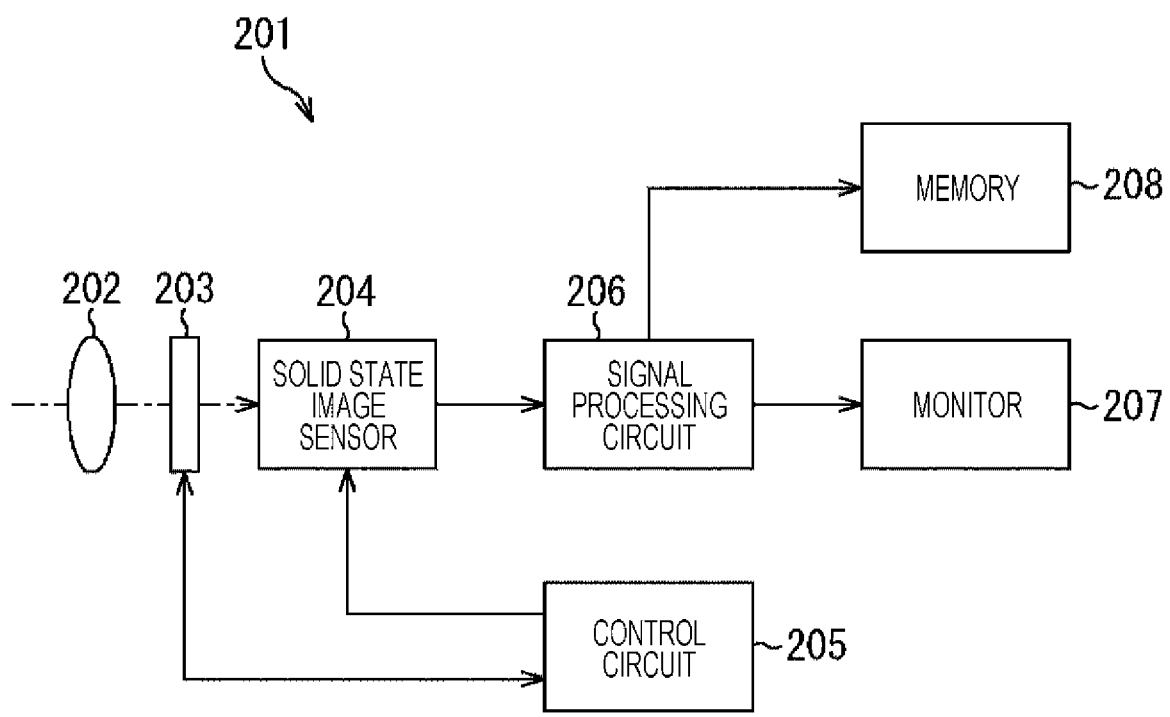
FIG. 11 is a block diagram illustrating a configuration example of an imaging device as an electronic device to which a solid state image sensor of an embodiment of the present technology is applied.

FIG. 11 is a block diagram illustrating a configuration example of an imaging device as an electronic device to which the present disclosure is applied.

An imaging device 201 illustrated in FIG. 11 includes an optical system 202, a shutter device 203, a solid state image sensor 204, a drive circuit 205, a signal processing circuit 206, a monitor 207, and a memory 208, and can image a still image and a moving image.

The optical system 202 includes one or a plurality of lenses, and guides light (incident light) from a subject to the solid state image sensor 204 to form an image on a light-receiving surface of the solid state image sensor 204.

The shutter device 203 is arranged between the optical system 202 and the solid state image sensor 204, and controls a light irradiation period and a light shielding period for the solid state image sensor 204 according to control of the drive circuit 205.

The solid state image sensor 204 is configured from a package including the integrated assembly according to the present invention including embodiments of the above-described solid state image sensor 14 (see FIGS. 2 to 10). The solid state image sensor 204 accumulates signal charges for a fixed period according to the light formed on the light-receiving surface through the optical system 202 and the shutter device 203. The signal charges accumulated in the solid state image sensor 204 are transferred according to a drive signal (timing signal) supplied from the drive circuit 205.

The drive circuit 205 outputs a transfer operation of the solid state image sensor 204 and a drive signal for controlling a shutter operation of the shutter device 203 to drive the solid state image sensor 204 and the shutter device 203.

The signal processing circuit 206 applies various types of signal processing to the signal charges output from the solid state image sensor 204. An image (image data) obtained by application of the signal processing by the signal processing circuit 206 is supplied to and displayed on the monitor 207 and is supplied to and stored (recorded) in the memory 208.

The imaging device 201 configured as described above can suppress generation of flare and ghosts caused by stray light by application of a lens group 12 and the solid state image sensor 14, in place of the above-described optical system 202 and solid state image sensor 204.

12. Use Example of Solid State Image Sensor

Figure 12:
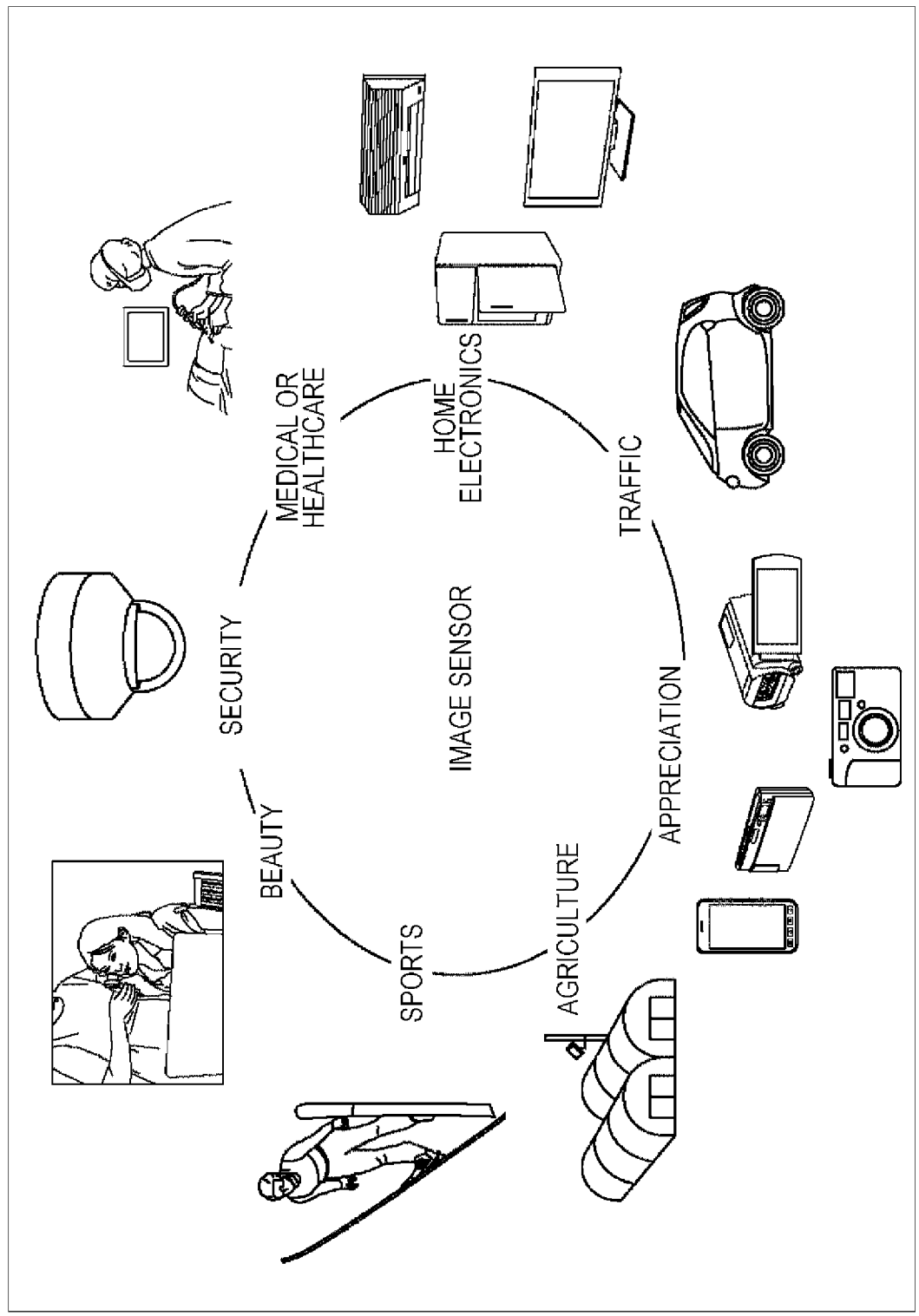
FIG. 12 is a diagram illustrating a use example of a solid state image sensor to which a technology of the present disclosure is applied.

FIG. 12 is a diagram illustrating a use example of the integrated assembly according to the present invention including the imaging device 1 and the solid state image sensor 14 in FIGS. 2 to 10.

The above-described imaging device 1 can be used in various cases of sensing light such as visible light, infrared light, ultraviolet light, and an X-rays.

A device that captures an image provided for appreciation use, such as a digital camera or a mobile device with a camera function.
  A device provided for traffic use, such as an in-vehicle sensor that captures the front and the rear, surroundings, and an interior of an automobile, a monitoring camera that monitors traveling vehicles and roads, or a distance measuring sensor that measures a distance between vehicles, for safe driving such as automatic stop and recognition of a state of a driver.
  A device provided for home electronics such as a television (TV), a refrigerator, and an air conditioner, for capturing a gesture of a user and operating the devices according to the gesture.
  A device provided for medical or health care use, such as an endoscope or a device that captures a blood vessel by receiving infrared light.
  A device provided for security use, such as a monitoring camera for crime-prevention use or a camera for person authentication use.
  A device provided for beauty use, such as skin measuring instrument that captures skin or a microscope that captures scalp.
  A device provided for sport use, such as an action camera or a wearable camera intended for sport use.
  A device provided for agricultural use, such as a camera that monitors states a field and crop.

13. Application Example to Endoscope Surgery System

The technology according to the present disclosure (present technology) can be applied to various products. For example, the technology according to the present disclosure may be applied to an endoscope surgery system.

Figure 13:
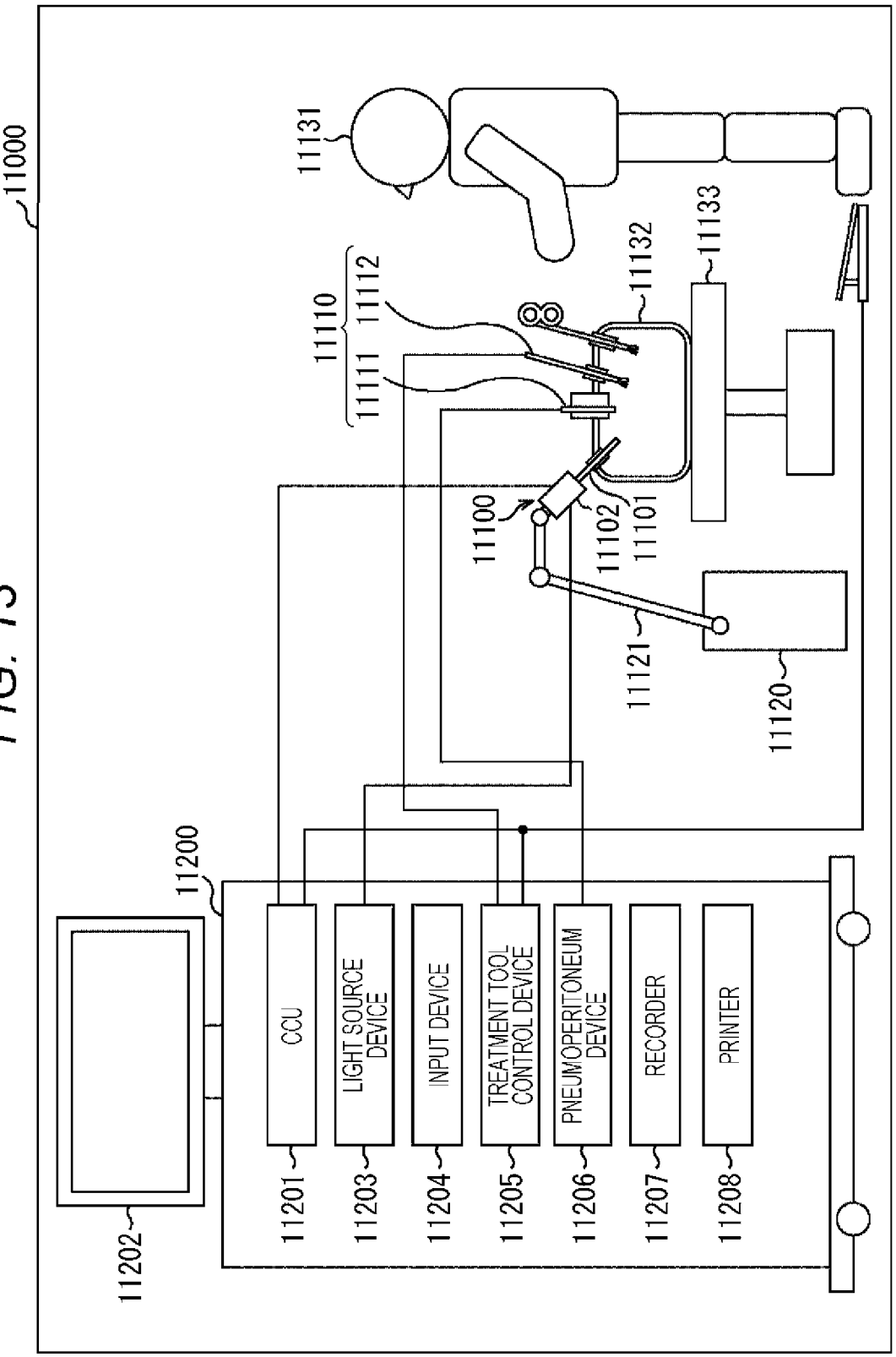
FIG. 13 is a diagram illustrating an example of a schematic configuration of an endoscope surgery system.

FIG. 13 is a diagram illustrating an example of a schematic configuration of an endoscope surgery system to which the technology according to the present disclosure (present technology) is applicable.

FIG. 13 illustrates a state in which an operator (doctor) 11131 is performing an operation on a patient 11132 on a patient bed 11133, using an endoscope surgery system 11000. As illustrated in FIG. 13, the endoscope surgery system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 13 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a direct-viewing endoscope, may be an oblique-viewing endoscope, or may be a side-viewing endoscope.

An optical system and an image sensor are provided inside the camera head 11102, and reflection light (observation light) from the observation target is condensed to the image sensor by the optical system. The observation light is photoelectrically converted by the image sensor, and an electrical signal corresponding to the observation light, that is, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Further, the CCU 11201 receives the image signal from the camera head 11102, and applies various types of image processing for displaying an image based on the image signal, such as developing processing (demosaic processing), to the image signal.

The display device 11202 displays the image based on the image signal to which the image processing has been applied by the CCU 11201, by control of the CCU 11201.

The light source device 11203 is configured from a light source such as a light emitting diode (LED), and supplies irradiation light to the endoscope 11100 in capturing an operation portion or the like.

An input device 11204 is an input interface for the endoscope surgery system 11000. A user can input various types of information and instructions to the endoscope surgery system 11000 through the input device 11204. For example, the user inputs an instruction to change imaging conditions (a type of irradiation light, a magnification, a focal length, and the like) by the endoscope 11100, and the like.

A treatment tool control device 11205 controls driving of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a test, an image, and a graph.

Note that the light source device 11203 that supplies the irradiation light in capturing the operation portion to the endoscope 11100 can be configured from a white light source configured from an LED, a laser light source, or a combination of the LED and the laser light. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Further, in this case, the observation target is irradiated with the laser light from each of the RGB laser light sources in a time division manner, and the driving of the image sensor of the camera head 11102 is controlled in synchronization with the irradiation timing, so that images respectively corresponding to RGB can be captured in a time division manner. According to the method, a color image can be obtained without providing a color filter to the image sensor.

Further, driving of the light source device 11203 may be controlled to change intensity of light to be output every predetermined time. The driving of the image sensor of the camera head 11102 is controlled in synchronization with change timing of the intensity of light and images are acquired in a time division manner, and the images are synthesized, so that a high-dynamic range image without clipped blacks and flared highlights can be generated.

Further, the light source device 11203 may be configured to be able to supply light in a predetermined wavelength band corresponding to special light observation. In the special light observation, so-called narrow band imaging is performed by radiating light in a narrower band than the irradiation light (that is, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to obtain fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image can be performed. The light source device 11203 can be configured to be able to supply narrow-band light and/or exciting light corresponding to such special light observation.

Figure 14:
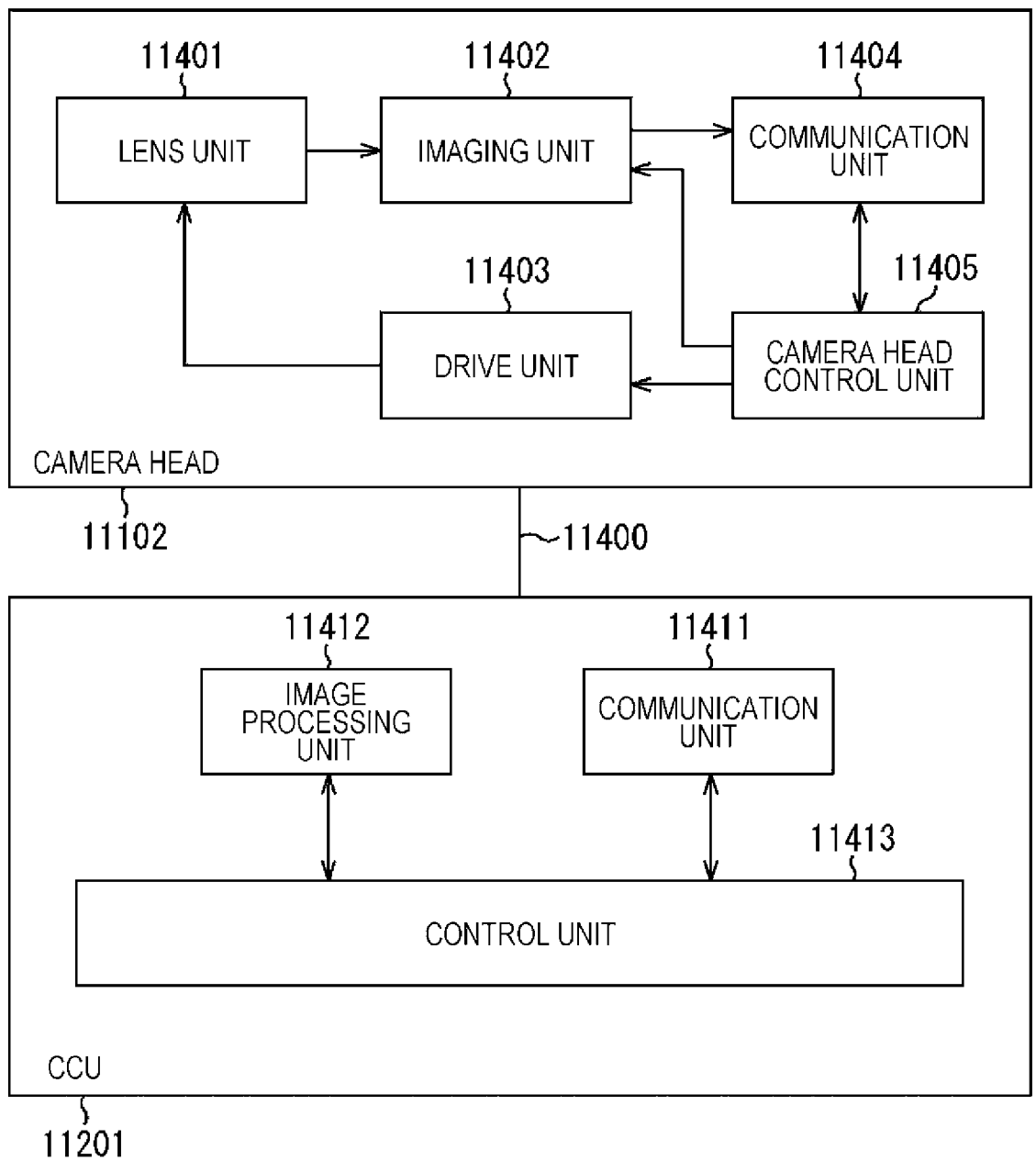
FIG. 14 is a block diagram illustrating an example of functional configurations of a camera head and a camera control unit (CCU).

FIG. 14 is a block diagram illustrating an example of functional configurations of the camera head 11102 and the CCU 11201 illustrated in FIG. 13.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured from a combination of a plurality of lenses including a zoom lens and a focus lens.

The imaging unit 11402 is configured from an image sensor comprising an integrated assembly according to the present invention including embodiments of the above-described solid state image sensor 14 (see FIGS. 2 to 10). The image sensor that configures the imaging unit 11402 may be one sensor (so-called single image sensor) or may be a plurality of sensors (so-called multiple image sensors). In a case where the imaging unit 11402 is configured from multiple image sensors, a color image may be obtained by generating image signals respectively corresponding to RGB by the image sensors and synthesizing the image signals. Alternatively, the imaging unit 11402 may be configured from a pair of image sensors for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured from the multiple image sensors, a plurality of systems of the lens units 11401 may be provided corresponding to the image sensors.

Further, the imaging unit 11402 may not be necessarily provided in the camera head 11102. For example, the imaging unit 11402 may be provided immediately after the object lens inside the lens-barrel 11101.

The drive unit 11403 is configured from an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured from a communication device for transmitting or receiving various types of information to or from the CCU 11201. The communication unit 11404 transmits the image signal obtained from the imaging unit 11402 to the CCU 11201 through the transmission cable 11400 as raw data.

Further, the communication unit 11404 receives a control signal for controlling driving of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls driving of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Further, the communication unit 11411 transmits a control signal for controlling driving of the camera head 11102 to the camera head 11102. The image signal and the control signal can be transmitted through telecommunication or optical communication.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling driving of the camera head 11102.

Further, the control unit 11413 displays the captured image of the operation portion in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as a forceps, a specific living body portion, blood, mist at the time of use of the energy treatment tool 11112, or the like, by detecting a shape of an edge or a color of an object included in the captured image. The control unit 11413 may superimpose and display various types of surgery support information on the image of the operation portion, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

In the illustrated example, the communication has been performed in a wired manner using the transmission cable 11400. However, the communication between the camera head 11102 and the CCU 11201 may be wirelessly performed.

An example of an endoscope surgery system to which the technology according to the present disclosure is applicable has been described. The technology according to the present disclosure can be applied to the endoscope 11100, (the imaging unit 11402) of the camera head 11102, (the image processing unit 11412) of the CCU 11201, or the like, of the above-described configurations. To be specific, the imaging device 1 comprising the integrated assembly according to the present invention including embodiments of the above-described solid state image sensor 14 in FIGS. 2 to 10 can be applied to the lens unit 11401 and the imaging unit 11402. By application of the technology according to the present disclosure to the lens unit 11401 and the imaging unit 11402, generation of flare and ghosts can be suppressed.

Note that, here, the endoscope surgery system has been described as an example. However, the technology according to the present disclosure may be applied to microsurgery, for example.

14. Application Example to Moving Body

The technology according to the present disclosure (present technology) can be applied to various products. For example, the technology according to the present disclosure may be realized as a device mounted on any type of moving bodies including an automobile, an electric automobile, a hybrid electric automobile, an electric motorcycle, a bicycle, a personal mobility, an airplane, a drone, a ship, and a robot.

Figure 15:
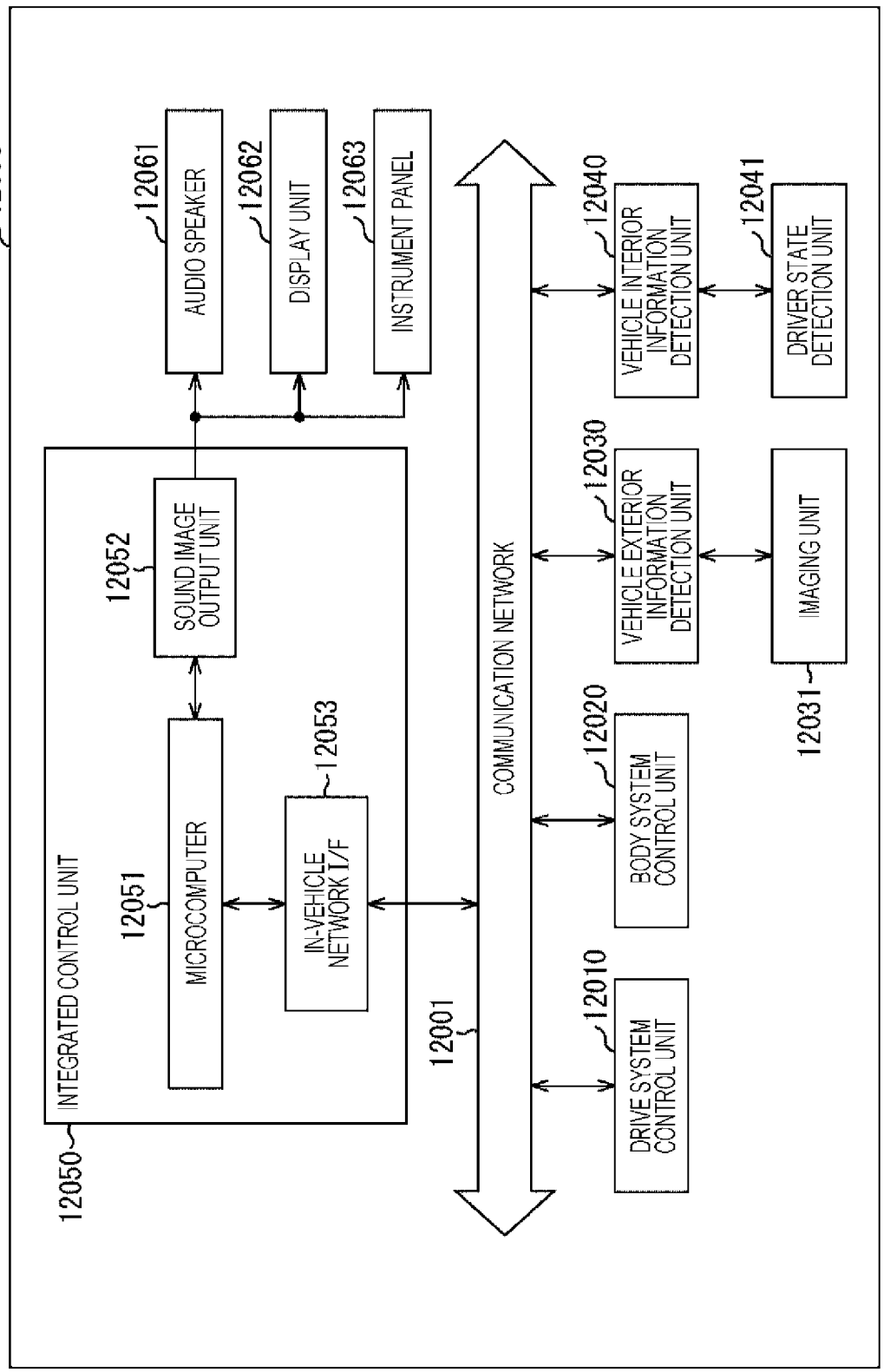
FIG. 15 is a block diagram illustrating an example of a schematic configuration of a vehicle control system.

FIG. 15 is a block diagram illustrating a schematic configuration example of a vehicle control system as an example of a moving body control system to which the technology of the present disclosure is applicable.

A vehicle control system 12000 includes a plurality of electronic control units connected through a communication network 12001. In the example illustrated in FIG. 15, the vehicle control system 12000 includes a drive system control unit 12010, a body system control unit 12020, a vehicle exterior information detection unit 12030, a vehicle interior information detection unit 12040, and an integrated control unit 12050. Further, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, and a braking device that generates braking force of a vehicle.

The body system control unit 12020 controls operations of devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like.

The vehicle exterior information detection unit 12030 detects information outside the vehicle that mounts the vehicle control system 12000. For example, an imaging unit 12031 is connected to the vehicle exterior information detection unit 12030. This imaging unit 12031 comprises an integrated assembly according to the present invention including embodiments of the above-described solid state image sensor 14 (see FIGS. 2 to 10). The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, or letters on a road surface on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Further, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether the driver falls asleep at the wheel on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, and lane out warning of the vehicle.

Further, the microcomputer 12051 controls the drive power generation device, the steering mechanism, or the braking device on the basis of the information around the vehicle acquired in the vehicle exterior information detection unit 12030 or the vehicle interior information detection unit 12040 to perform cooperative control for the purpose of automatic driving of autonomous travel without depending on an operation of the driver.

Further, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound and an image to an output device that can visually and aurally notify information to a passenger of the vehicle or an outside of the vehicle. In the example in FIG. 15, as the output device, an audio speaker 12061, a display unit 12062, and an instrument panel 12063 are exemplarily illustrated. The display unit 12062 may include at least one of an on-board display and a head-up display.

Figure 16:
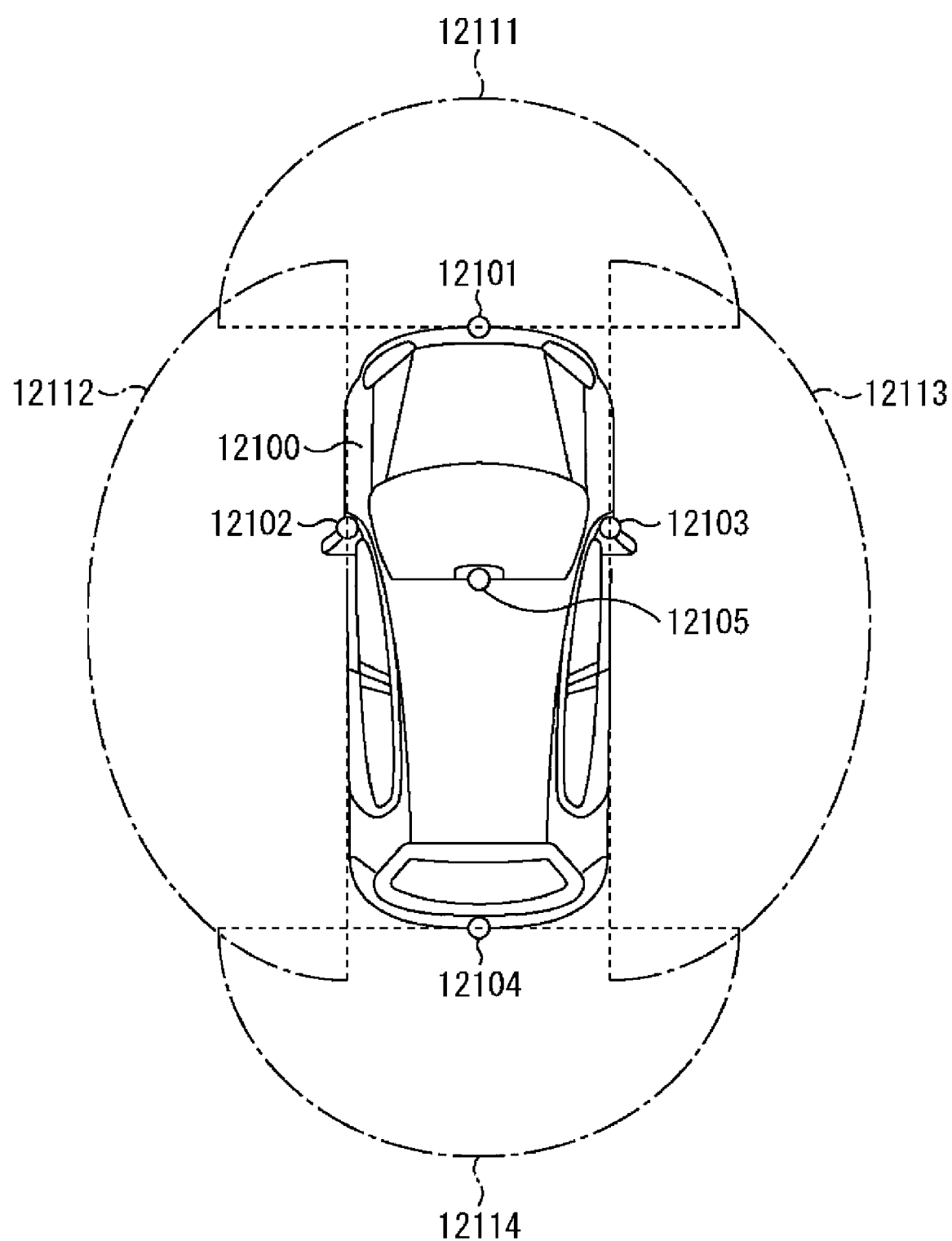
FIG. 16 is an explanatory diagram illustrating an example of installation positions of a vehicle exterior information detection unit and an imaging unit.

FIG. 16 is a diagram illustrating an example of an installation position of the imaging unit 12031.

In FIG. 16, a vehicle 12100 includes, as the imaging unit 12031, imaging units 12101, 12102, 12103, 12104, and 12105.

The imaging units 12101, 12102, 12103, 12104, and 12105 are provided at positions of a front nose, side mirrors, a rear bumper or a back door, and an upper portion of a windshield in an interior of the vehicle 12100, for example. Each of these imaging units 12101, 12102, 12103, 12104 and 12105 may comprise an integrated assembly according to the present invention including embodiments of the above-described solid state image sensor 14 (see FIGS. 2 to 10). The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, or a lane.

Note that FIG. 16 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured in the imaging units 12101 to 12104.

At least one of the imaging units 12101 to 12104 may have a function to acquire distance information. For example, at least one of the imaging units 12101 to 12104 may be a stereo camera including a plurality of image sensors or may be an image sensor having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract a three-dimensional object closest to the vehicle 12100 on a traveling road and traveling at a predetermined speed (for example, 0 km/h or more) in approximately the same direction as the vehicle 12100 as a leading vehicle. Further, the microcomputer 12051 can set a vehicular gap to be secured from the leading vehicle in advance and perform automatic braking control (including following stop control) and automatic acceleration control (including following start control), and the like. In this way, the cooperative control for the purpose of automatic driving of autonomous travel without depending on an operation of the driver can be performed.

For example, the microcomputer 12051 extracts and classifies three-dimensional object data regarding three-dimensional objects into two-wheeled vehicles, ordinary cars, large vehicles, pedestrians, and other three-dimensional objects such as electric poles, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether a pedestrian exists in the captured images of the imaging units 12101 to 12104, thereby to recognize the pedestrian. The recognition of a pedestrian is performed by a process of extracting characteristic points in the captured images of the imaging units 12101 to 12104, as the infrared camera, and by a process of performing pattern matching processing for the series of characteristic points indicating a contour of an object and discriminating whether the object is a pedestrian. When the microcomputer 12051 determines that a pedestrian exists in the captured images of the imaging units 12101 to 12104 and recognizes the pedestrian, the sound image output unit 12052 controls the display unit 12062 to superimpose and display a square contour line for emphasis on the recognized pedestrian. Further, the sound image output unit 12052 may control the display unit 12062 to display an icon representing the pedestrian at a desired position.

An example of a vehicle control system to which the technology according to the present disclosure is applicable has been described. The technology according to the present disclosure is applicable to the imaging unit 12031, of the above-described configurations, for example. To be specific, the integrated assembly according to the present invention including embodiments of the above-described solid state image sensor 14 (see FIGS. 2 to 10) can be applied to the imaging unit 12031. By application of the technology according to the present disclosure to the imaging unit 12031, generation of flare and ghosts can be suppressed.

Note that the present disclosure can have the following configurations.

<1> An integrated assembly including
a pixel array configured to generate a pixel signal according to an amount of incident light by photoelectric conversion in units of pixels arranged in an array manner,
a glass substrate bonded with a light-receiving surface of the pixel array, and
a light-shielding film formed on a peripheral portion that is an outside of an effective pixel region of the pixel array, in which
the light-shielding film is formed at a front stage of the glass substrate with respect to an entering direction of the incident light.

<2> The integrated assembly according to <1>, in which the light-shielding film is formed on the glass substrate.

<3> The integrated assembly according to <2>, in which an infrared light cut filter that cuts infrared light, of the incident light, is further formed on the glass substrate at the front stage of the glass substrate and on the light-shielding film.

<4> The integrated assembly according to <3>, in which a non-flat film is further formed on the infrared light cut filter at a front stage of the infrared light cut filter.

<5> The integrated assembly according to <3>, in which the non-flat film has higher non-flatness than a predetermined value.

<6> The integrated assembly according to <2>, in which the light-shielding film is a photosensitive black resist and is formed on the glass substrate by photolithography.

<7> The integrated assembly according to <1>, further including
an infrared light cut filter that cuts infrared light, of the incident light, on a light-receiving surface in the glass substrate, and
the light-shielding film is formed at a front stage of the infrared light cut filter.

<8> The integrated assembly according to <7>, in which the light-shielding film is formed on the infrared light cut filter.

<9> The integrated assembly according to <8>, further including
a non-flat film formed at a front stage of the infrared light cut filter.

<10> The integrated assembly according to <9>, in which
the non-flat film has higher non-flatness than a predetermined value.

<11> The integrated assembly according to <8>, in which
the light-shielding film is a photosensitive black resist and is formed on the infrared light cut filter by photolithography.

<12> The integrated assembly according to <1>, further including
an infrared light cut filter that cuts infrared light, of the incident light, on a light-receiving surface in the glass substrate, and
a non-flat film formed at a front stage of the infrared light cut filter, in which the light-shielding film is formed at a front stage of the non-flat film.

<13> The integrated assembly according to <12>, in which the light-shielding film is formed on the non-flat film.

<14> The integrated assembly according to <13>, in which
the light-shielding film is a non-photosensitive black resist and is formed on the non-flat film by inkjet.

<15> The integrated assembly according to <13>, in which
the non-flat film has higher non-flatness than a predetermined value.

<16> The integrated assembly according to any of <1> to <15>, in which
the glass substrate is bonded with the light-receiving surface of the pixel array with a transparent adhesive.

<17> The integrated assembly according to <16>, in which
the pixel array and the glass substrate are bonded in a state where a cavity exists.

<18> The integrated assembly according to <17>, in which
the cavity is formed of a spacer.

<19> A solid state image sensor including
a pixel array configured to generate a pixel signal according to an amount of incident light by photoelectric conversion in units of pixels arranged in an array manner,
a glass substrate bonded with a light-receiving surface of the pixel array, and
a light-shielding film formed on a peripheral portion that is an outside of an effective pixel region of the pixel array, in which
the light-shielding film is formed at a front stage of the glass substrate with respect to an entering direction of the incident light.

<20> An electronic device including
a pixel array configured to generate a pixel signal according to an amount of incident light by photoelectric conversion in units of pixels arranged in an array manner,
a glass substrate bonded with a light-receiving surface of the pixel array, and
a light-shielding film formed on a peripheral portion that is an outside of an effective pixel region of the pixel array, in which
the light-shielding film is formed at a front stage of the glass substrate with respect to an entering direction of the incident light.

<21> An integrated assembly comprising: a pixel array mounted in an integrated assembly; an optical assembly comprising one or more transparent materials mounted with the pixel array in the integrated assembly; and a light shield arranged to block light at a periphery of the integrated assembly, a part of the light shield disposed on at least one of the one or more transparent materials.

<22> The integrated assembly according to <21>, wherein the optical assembly comprises a glass substrate that is bonded to the pixel array and the light shield is formed on a periphery of the glass substrate.

<23> The integrated assembly according to <22>, further comprising a non-flat film formed on the glass substrate.

<24> The integrated assembly according to <22> or <23>, further comprising a cavity formed between a central region of the pixel array and a central region of the glass substrate.

<25> The integrated assembly according to any one of <21> to <24>, wherein the pixel array and glass substrate are part of a chip size package.

<26> The integrated assembly according to <21> or <22>, further comprising a non-flat film formed on the optical assembly.

<27> The integrated assembly according to <26>, further comprising a cavity formed between a central region of the pixel array and a central region of the optical assembly,
wherein the light shield is formed on at least a peripheral region of the non-flat film.

<28> The integrated assembly according to <21> or <25>, wherein the optical assembly comprises a glass substrate and an infrared filter formed on the glass substrate, wherein the glass substrate is bonded to the pixel array and the light shield is formed on a periphery of the infrared filter.

<29> The integrated assembly according to <28>, further comprising a non-flat film formed on the infrared filter.

<30> The integrated assembly according to <21> or <25>, wherein the optical assembly comprises a glass substrate that is bonded to the pixel array; and an infrared filter formed on the glass substrate, the integrated assembly further comprising a non-flat film formed on the infrared filter, wherein the light shield is formed on at least a peripheral region of the non-flat film.

<31> The integrated assembly according to <21> or <25>, wherein the optical assembly comprises an infrared filter that is bonded to the pixel array and the light shield is formed on a periphery of the infrared filter.

<32> The integrated assembly according to <31>, further comprising a non-flat film formed on the infrared filter.

<33> An imaging device comprising the integrated assembly according to one of <1> to <32>.

<34> A camera module including an imaging apparatus, the imaging apparatus comprising a pixel array mounted in an integrated assembly; an optical assembly comprising one or more transparent materials mounted with the pixel array in the integrated assembly; a light shield arranged to block light at a periphery of the integrated assembly, a part of the light shield disposed on at least one of the one or more transparent materials; and a plurality of lenses mounted apart from the pixel array.

<35> An electronic apparatus comprising a pixel array mounted in an integrated assembly; an optical assembly comprising one or more transparent materials mounted with the pixel array in the integrated assembly; and a light shield arranged to block light at a periphery of the integrated assembly, a part of the light shield disposed on at least one of the one or more transparent materials, the electronic apparatus further comprising a plurality of lenses mounted apart from the pixel array; a signal processing circuit arranged to receive signals from sensors in the pixel array; memory arranged to store image data; a monitor arranged to display image data; and a drive circuit configured to control transfer of signal electric charges in the solid state image sensor.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Imaging device
11 Case
12 Lens group
13 Infrared cut filter IRCF
13a Light-shielding film
14, 204 Solid state image sensor, integrated assembly
31 Pixel array
32 Adhesive
33 Glass substrate
34 Light-shielding film
Z1 central portion
Z2 peripheral portion
34' Light shielding film
51 Infrared cut filter, IRCF
71 Non-flat film
81 Cavity
91 Spacer

The invention claimed is:

1. An integrated assembly for an imaging device comprising:
a pixel array;
an optical assembly comprising one or more transparent materials mounted with the pixel array in the integrated assembly; and
a light shield arranged to block light at a periphery of the integrated assembly, wherein a part of the light shield is disposed on at least one of the one or more transparent materials, wherein the optical assembly comprises a transparent substrate and wherein a width of a substrate including the pixel array is the same as a width of the transparent substrate.

2. The integrated assembly of claim 1, wherein the optical assembly comprises a glass substrate that is bonded to the pixel array and the light shield is formed on a periphery of the glass substrate.

3. The integrated assembly of claim 2, further comprising a non-flat film formed on the glass substrate.

4. The integrated assembly of claim 3, further comprising a cavity formed between a central region of the pixel array and a central region of the glass substrate.

5. The integrated assembly of claim 2, wherein the pixel array and glass substrate are part of a chip size package.

6. The integrated assembly of claim 1, further comprising a non-flat film formed on the optical assembly.

7. The integrated assembly of claim 6, further comprising a cavity formed between a central region of the pixel array and a central region of the optical assembly, wherein the light shield is formed on at least a peripheral region of the non-flat film.

8. The integrated assembly of claim 1, wherein the optical assembly comprises a glass substrate and an infrared filter formed on the glass substrate, wherein the glass substrate is bonded to the pixel array and the light shield is formed on a periphery of the infrared filter.

9. The integrated assembly of claim 8, further comprising a non-flat film formed on the infrared filter.

10. The integrated assembly of claim 1, wherein the optical assembly comprises:
a glass substrate that is bonded to the pixel array; and
an infrared filter formed on the glass substrate, the integrated assembly further comprising
a non-flat film formed on the infrared filter, wherein the light shield is formed on at least a peripheral region of the non-flat film.

11. The integrated assembly of claim 1, wherein the optical assembly comprises an infrared filter that is bonded to the glass substrate and the light shield is formed on a periphery of the infrared filter.

12. The integrated assembly of claim 11, further comprising a non-flat film formed on the infrared filter.

13. An imaging device, comprising a lens group and an integrated assembly according to claim 1.

14. A camera module including an imaging apparatus, the imaging apparatus comprising:
integrated assembly according to claim 1; and
a plurality of lenses mounted apart from the pixel array.

15. An electronic apparatus comprising:
a solid state image sensor comprising:
integrated assembly according to claim 1;
a plurality of lenses mounted apart from the pixel array;
a signal processing circuit arranged to receive signals from sensors in the pixel array;
memory arranged to store image data;
a monitor arranged to display image data; and
a control circuit configured to control transfer of signal electric charges in the solid state image sensor.

* * * * *